(12) United States Patent
Huang et al.

(10) Patent No.: US 11,189,531 B2
(45) Date of Patent: Nov. 30, 2021

(54) FIN FIELD-EFFECT TRANSISTOR DEVICE AND METHOD

(71) Applicant: Taiwan Semiconductor Manufacturing Company, Ltd., Hsinchu (TW)

(72) Inventors: Lin-Yu Huang, Hsinchu (TW); Sheng-Tsung Wang, Hsinchu (TW); Chia-Hao Chang, Hsinchu (TW); Tien-Lu Lin, Hsinchu (TW); Yu-Ming Lin, Hsinchu (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 48 days.

(21) Appl. No.: 16/550,083

(22) Filed: Aug. 23, 2019

(65) Prior Publication Data

US 2021/0057285 A1 Feb. 25, 2021

(51) Int. Cl.
*H01L 21/8234* (2006.01)
*H01L 27/088* (2006.01)
*H01L 29/66* (2006.01)

(52) U.S. Cl.
CPC ........ *H01L 21/823475* (2013.01); *H01L 21/823431* (2013.01); *H01L 21/823437* (2013.01);
(Continued)

(58) Field of Classification Search
CPC ........ H01L 21/823475; H01L 27/0886; H01L 21/823437; H01L 29/66545; H01L 21/823481; H01L 21/823431; H01L 29/41791; H01L 29/785; H01L 29/66795; H01L 21/823468; H01L 29/66348; H01L 29/7855; H01L 21/768
See application file for complete search history.

(56) References Cited

U.S. PATENT DOCUMENTS 6,001,726 A 12/1999 Nagabushnam et al.
8,772,109 B2 7/2014 Colinge
(Continued)

FOREIGN PATENT DOCUMENTS

KR 20150106376 A 9/2015
KR 20190002301 A 1/2019
(Continued)

*Primary Examiner* — Su C Kim
(74) *Attorney, Agent, or Firm* — Slater Matsil, LLP

(57) ABSTRACT

A method includes forming a first dummy gate and a second dummy gate over a fin that protrudes above a substrate; replacing the first dummy gate and the second dummy gate with a first metal gate and a second metal gate, respectively; forming a dielectric cut pattern between the first and the second metal gates, the dielectric cut pattern extending further from the substrate than the first and the second metal gates; forming a patterned mask layer over the first metal gate, the second metal gate, and the dielectric cut pattern, an opening in the patterned mask layer exposing a portion of the first metal gate, a portion of the second metal gate, and a portion of the dielectric cut pattern underlying the opening; filling the opening with a first electrically conductive material; and recessing the first electrically conductive material below an upper surface of the dielectric cut pattern.

20 Claims, 29 Drawing Sheets

(52) U.S. Cl.
CPC .. *H01L 21/823481* (2013.01); *H01L 27/0886* (2013.01); *H01L 29/66545* (2013.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,608,065 B1 | 3/2017 | Bergdahl et al. |
| 9,627,379 B1 | 4/2017 | Chang et al. |
| 9,768,170 B2 | 9/2017 | Chang et al. |
| 9,831,183 B2 | 11/2017 | Lin et al. |
| 9,859,386 B2 | 1/2018 | Ho et al. |
| 9,899,271 B2 | 2/2018 | Chang et al. |
| 2015/0235897 A1* | 8/2015 | Fu .................. H01L 29/78 438/299 |
| 2015/0263131 A1 | 9/2015 | Metz |
| 2016/0056181 A1 | 2/2016 | Anderson et al. |
| 2016/0351677 A1* | 12/2016 | Bao ................. H01L 21/823475 |
| 2017/0309715 A1 | 10/2017 | Huang et al. |
| 2017/0330834 A1 | 11/2017 | Basker et al. |
| 2018/0211875 A1* | 7/2018 | Basker .............. H01L 29/66795 |
| 2018/0342420 A1 | 11/2018 | You et al. |
| 2019/0006345 A1 | 1/2019 | Wang et al. |
| 2019/0027604 A1 | 1/2019 | Lee et al. |
| 2019/0131171 A1 | 5/2019 | Gwak et al. |
| 2019/0164960 A1 | 5/2019 | Chen et al. |
| 2020/0027786 A1* | 1/2020 | Lee .................. H01L 21/76895 |

FOREIGN PATENT DOCUMENTS

| | | |
|---|---|---|
| KR | 20190049166 A | 5/2019 |
| TW | 201642326 A | 12/2016 |
| TW | 201727833 A | 8/2017 |
| TW | 201729264 A | 8/2017 |
| TW | 201733123 A | 9/2017 |
| TW | 201737349 A | 10/2017 |

* cited by examiner

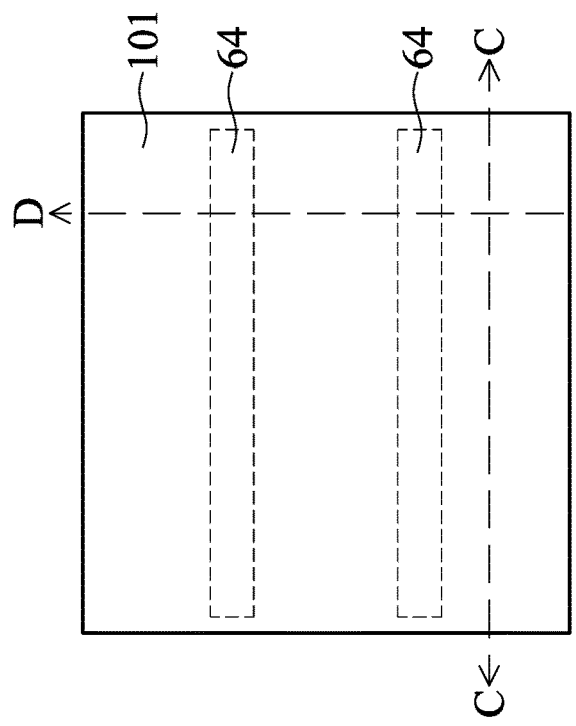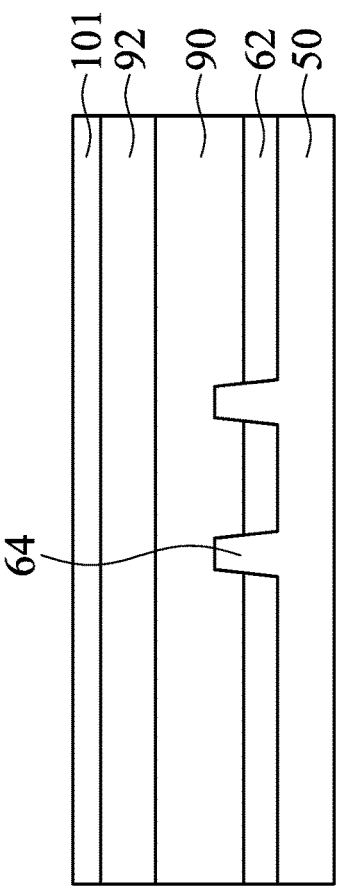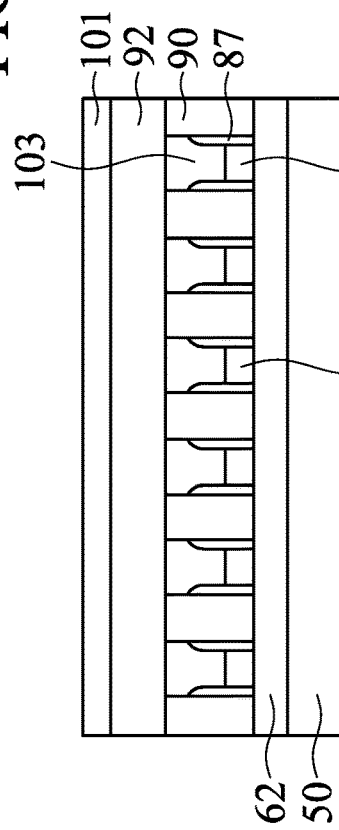
FIG. 10A
FIG. 10B
FIG. 10C

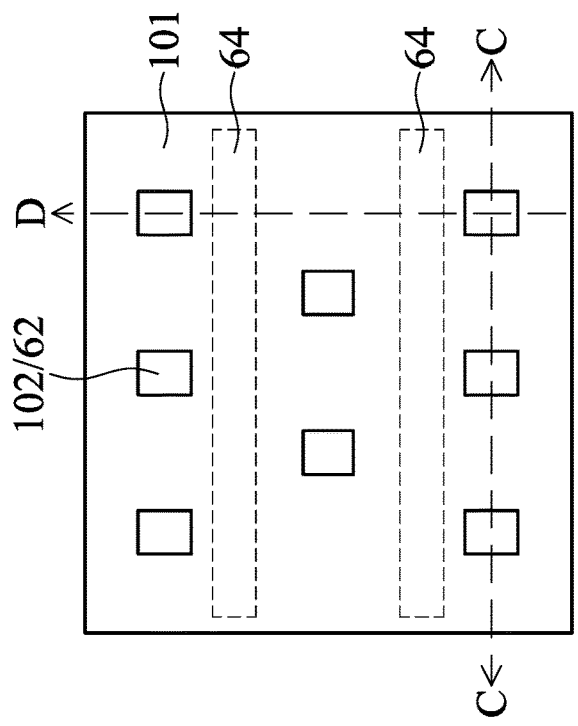
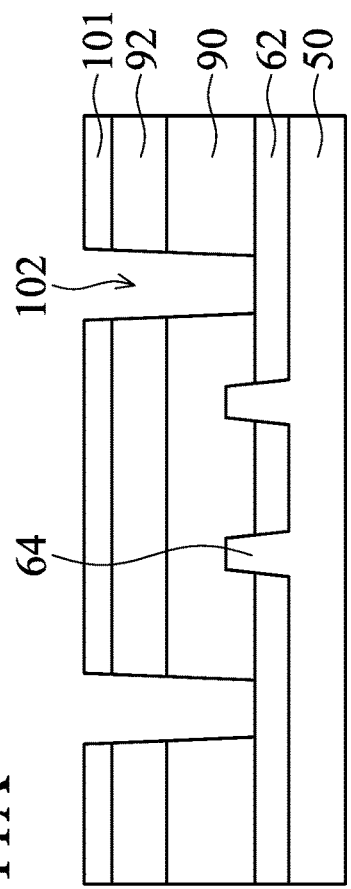
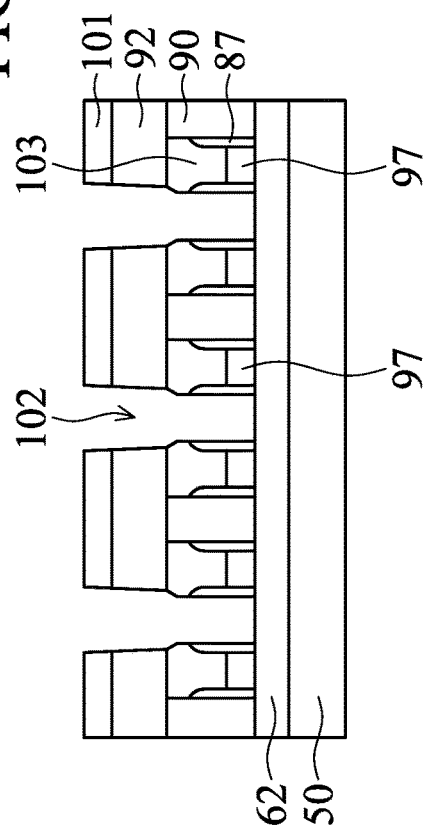
FIG. 11A
FIG. 11B
FIG. 11C

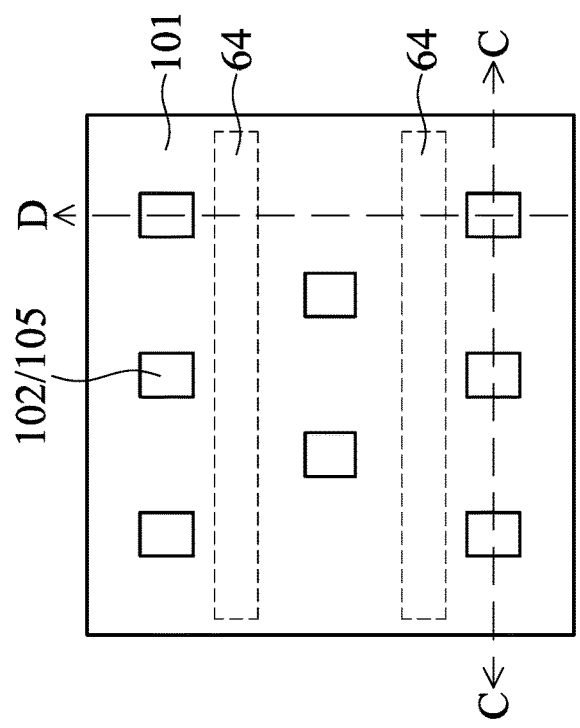
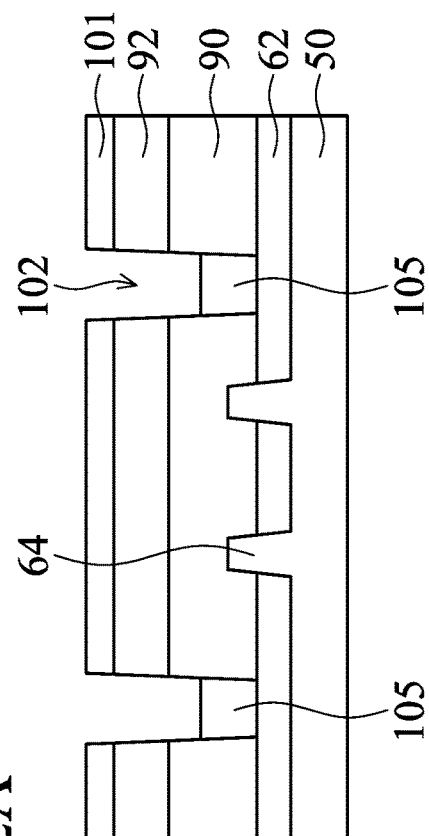
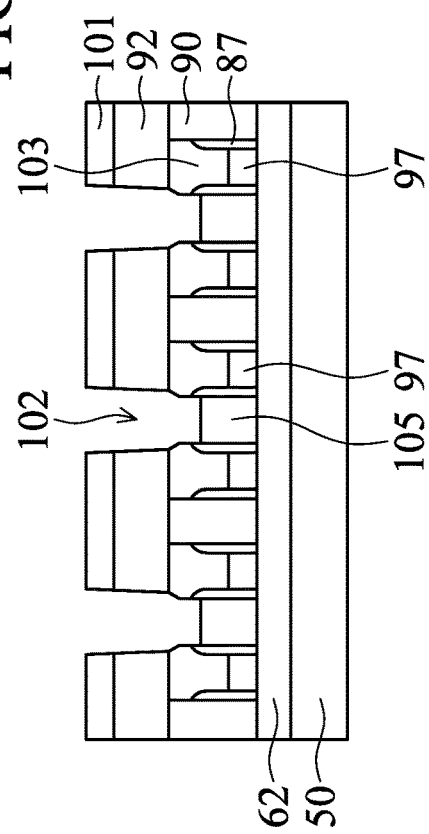
FIG. 12A
FIG. 12B
FIG. 12C

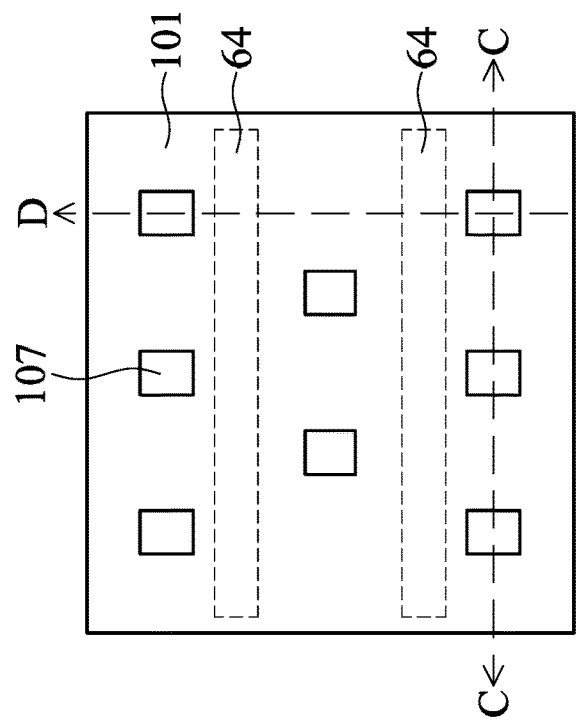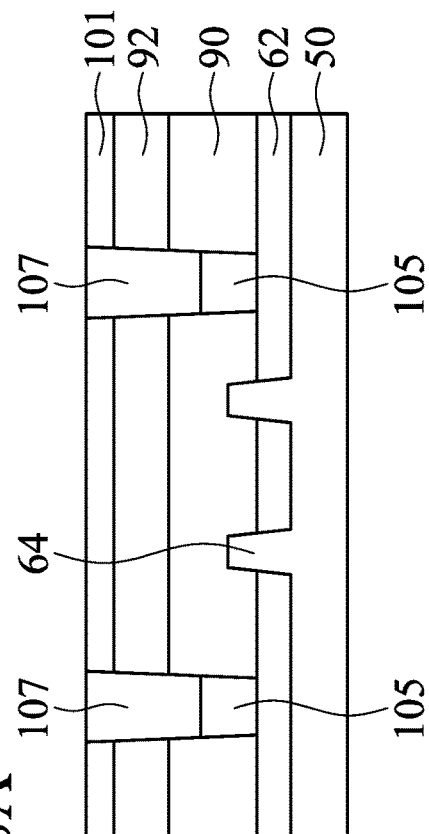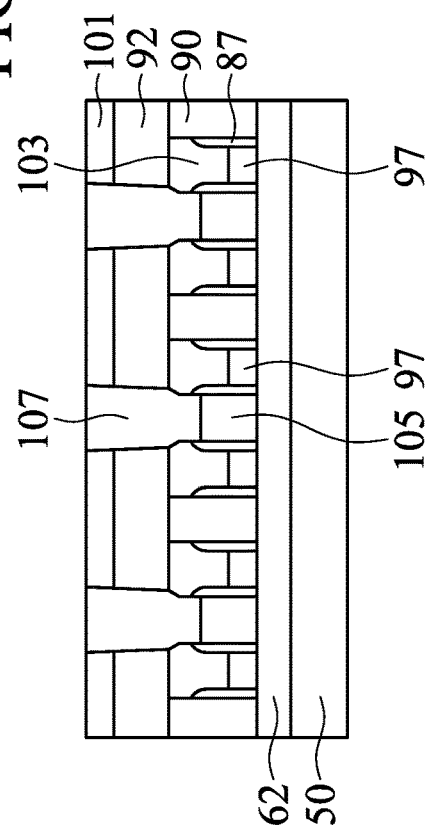
FIG. 13A
FIG. 13C
FIG. 13B

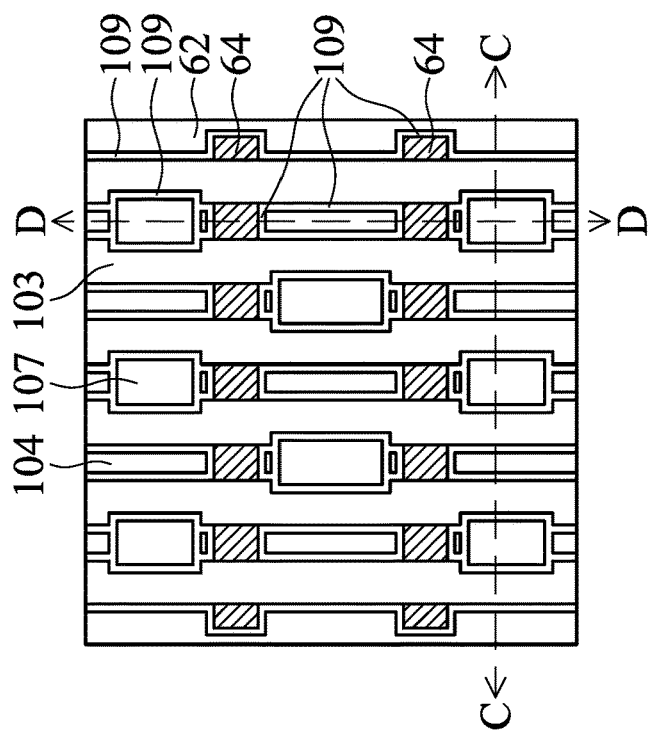
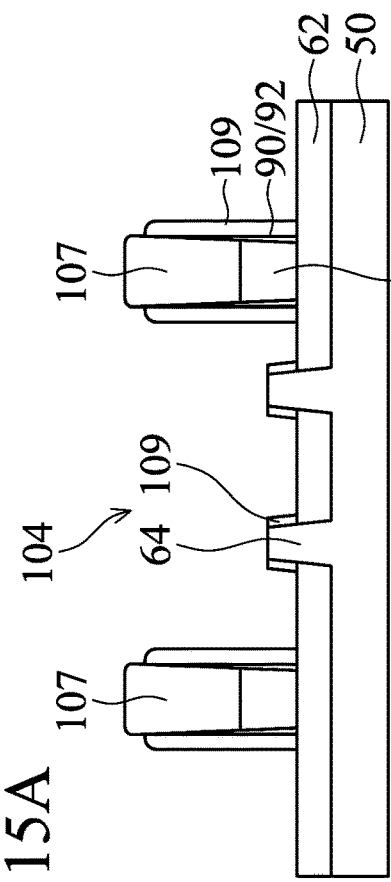
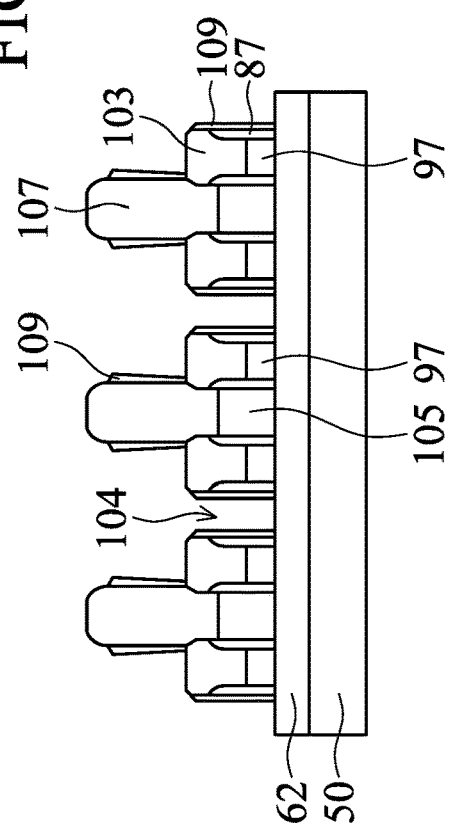
FIG. 15A
FIG. 15B
FIG. 15C

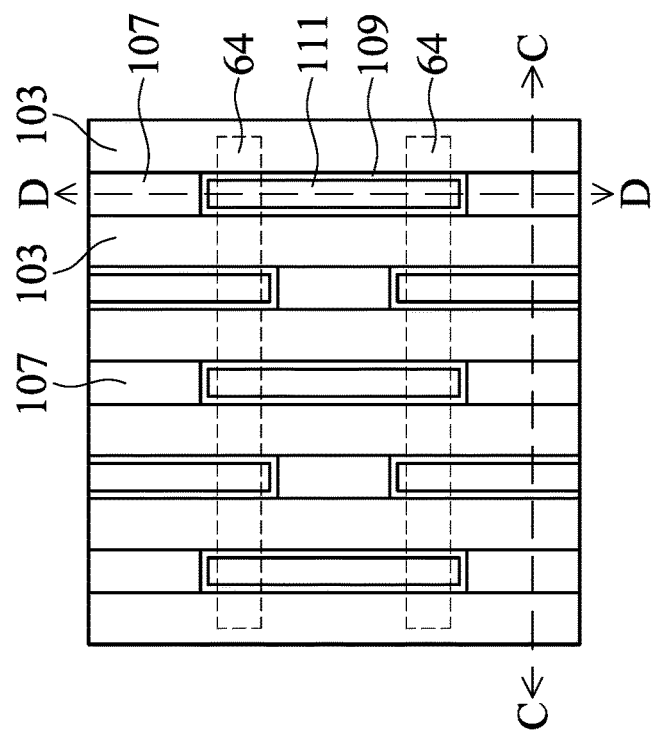
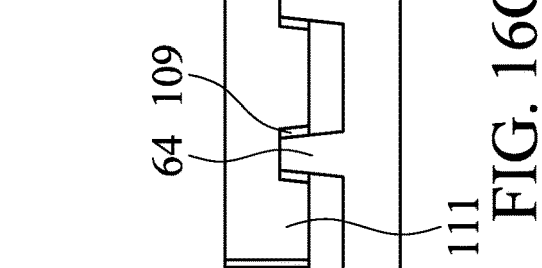
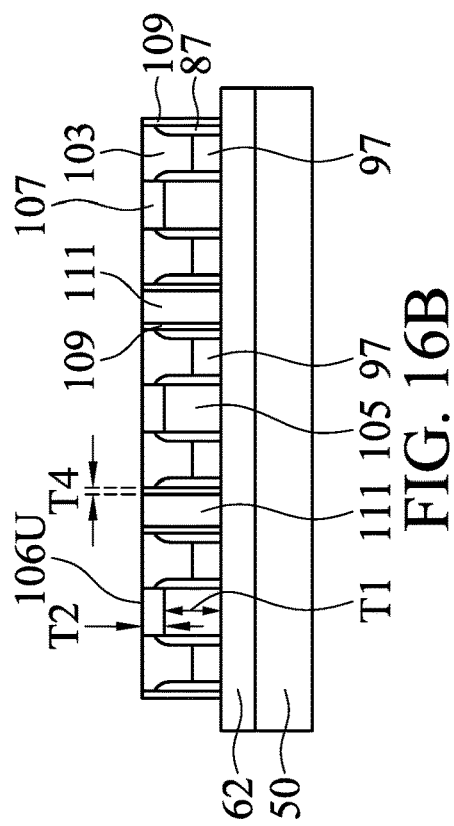
FIG. 16A
FIG. 16B
FIG. 16C

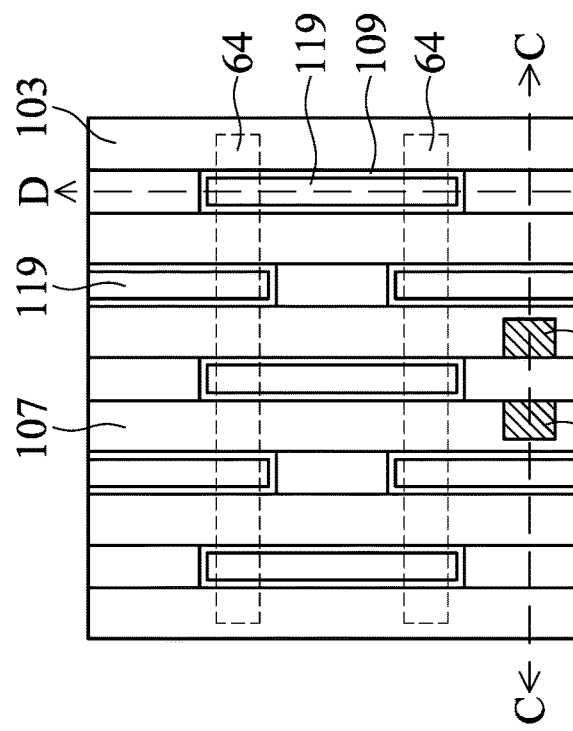
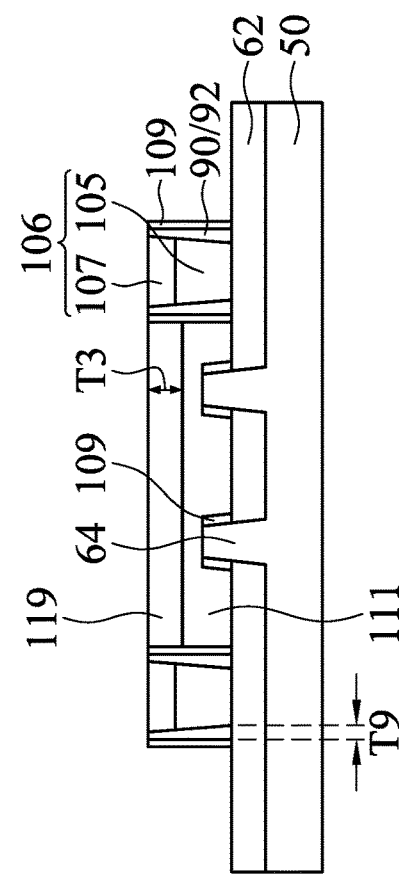
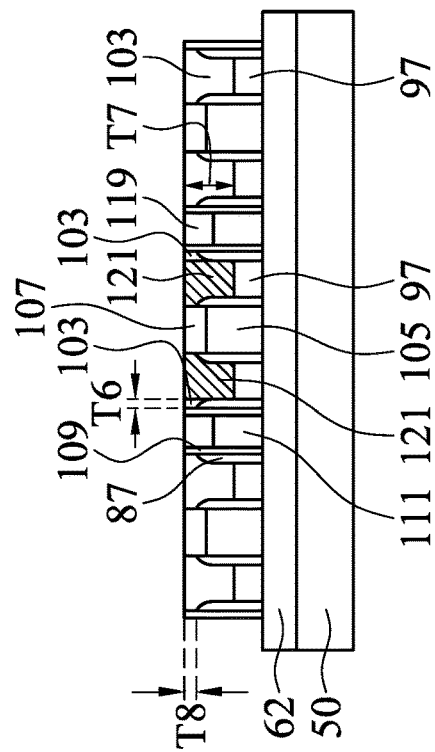
FIG. 18A
FIG. 18B
FIG. 18C

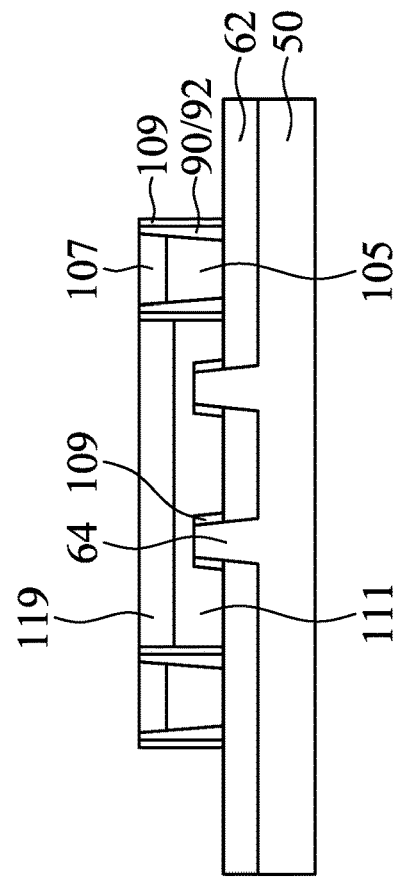
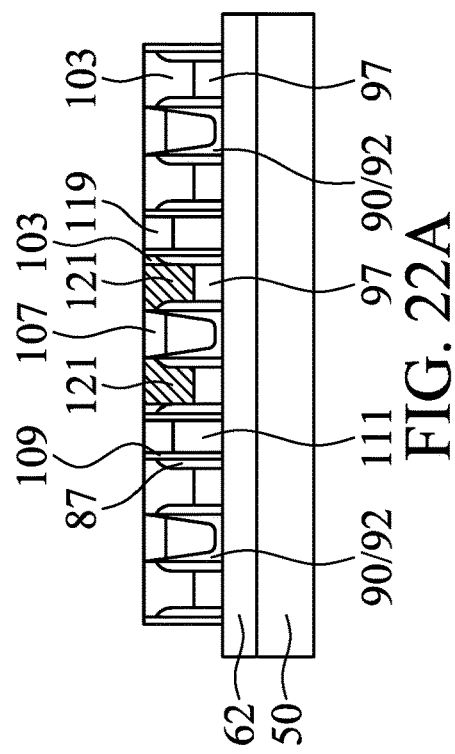
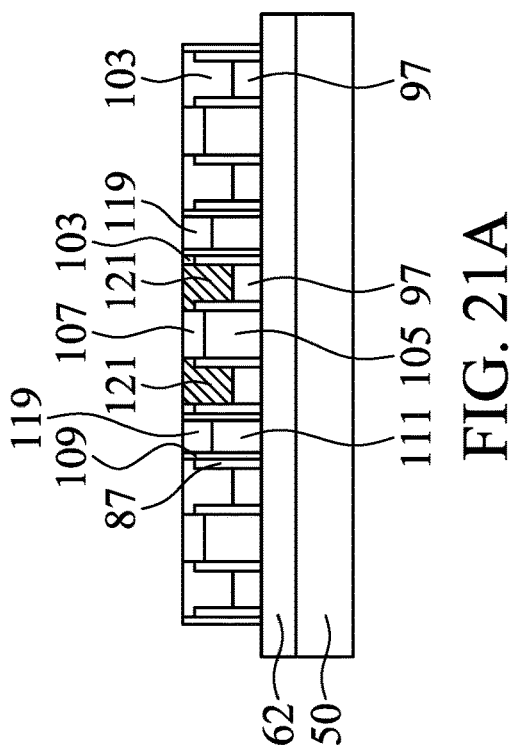

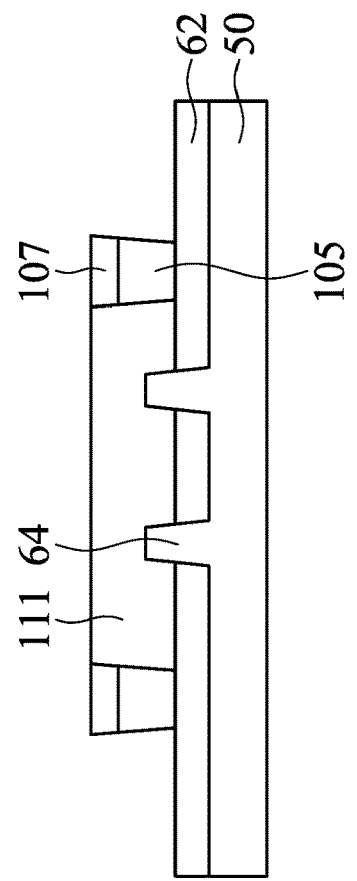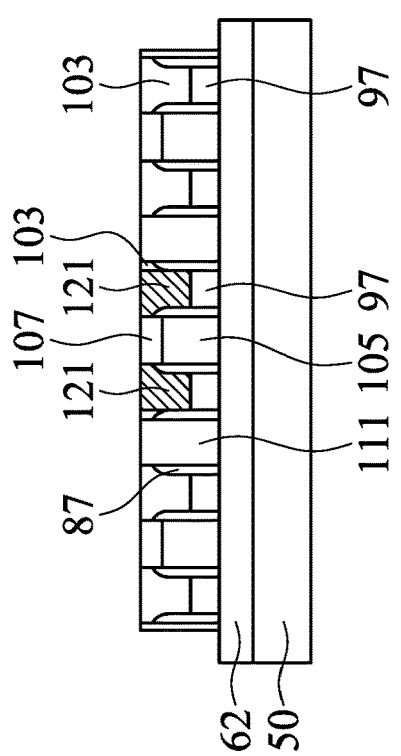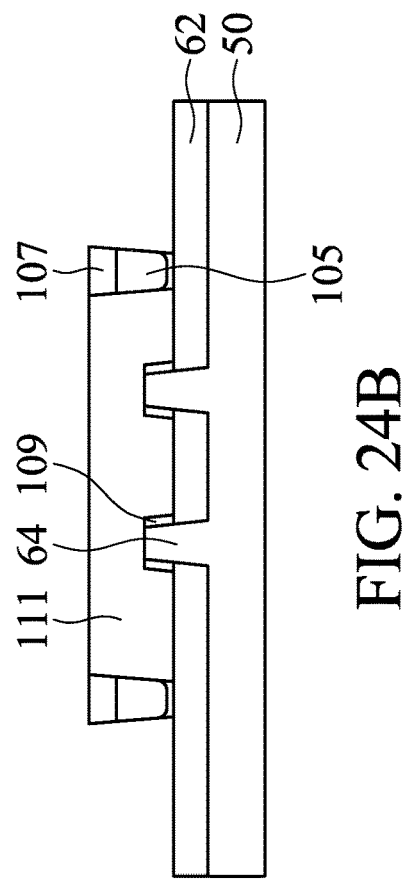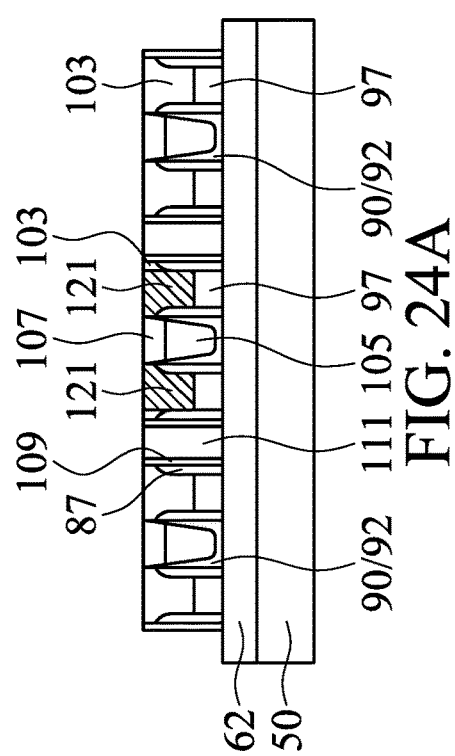

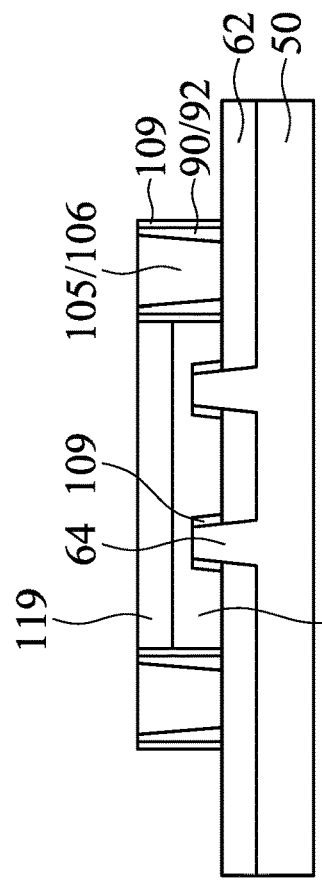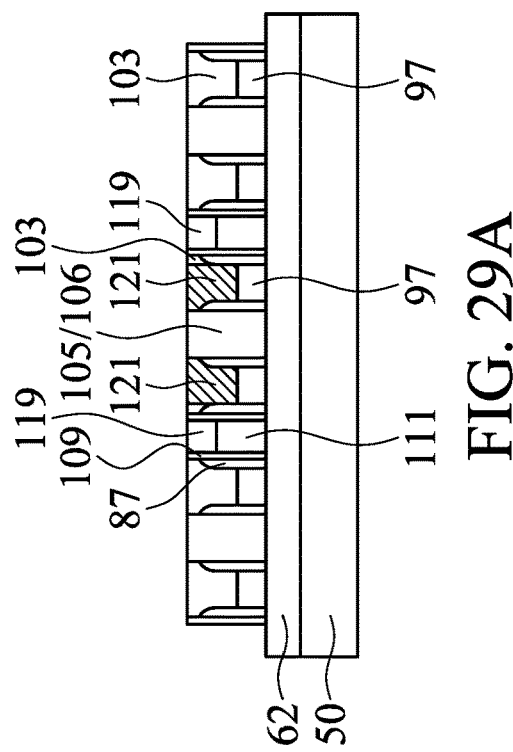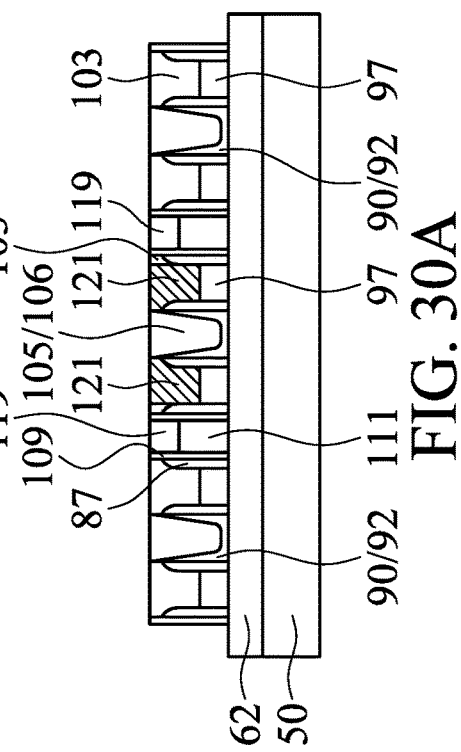

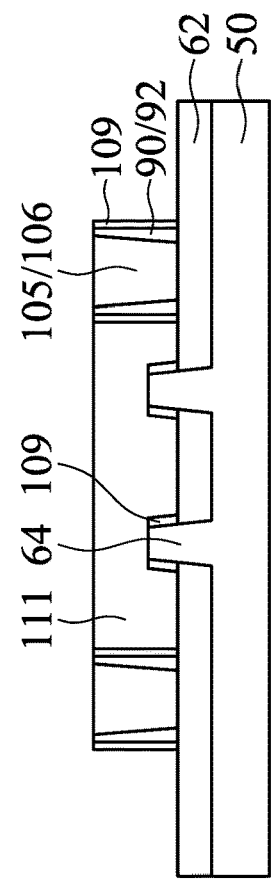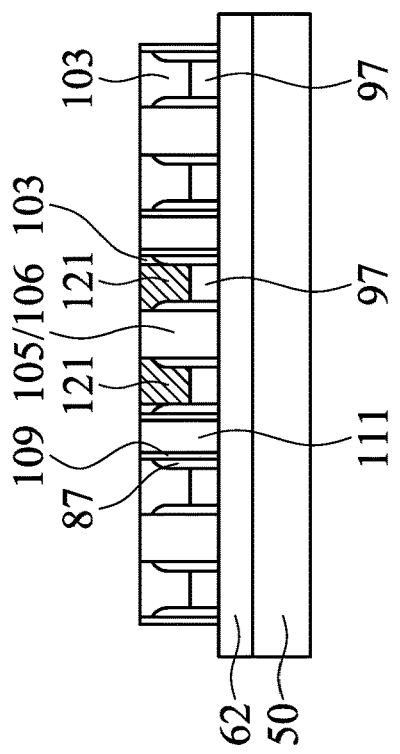
FIG. 33B
FIG. 33A
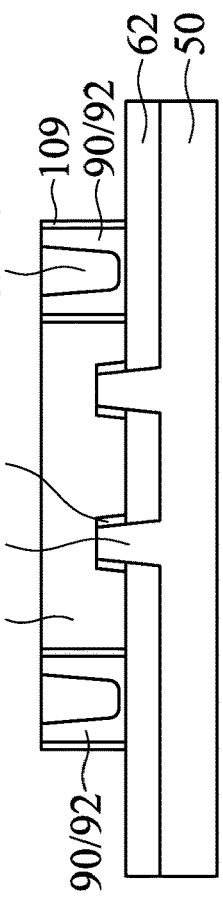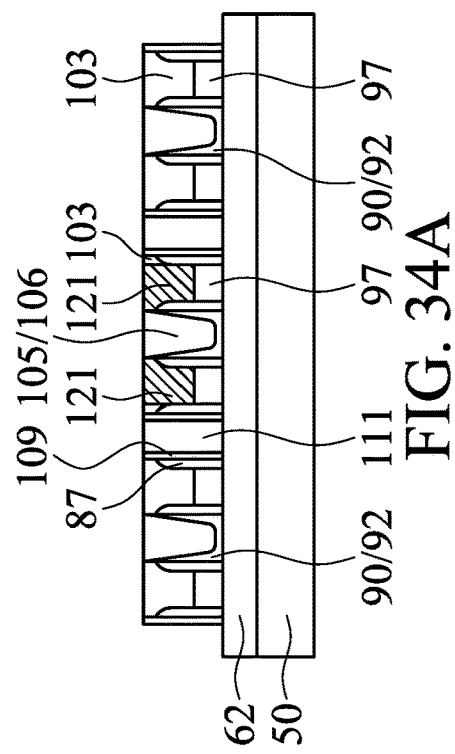
FIG. 34B
FIG. 34A

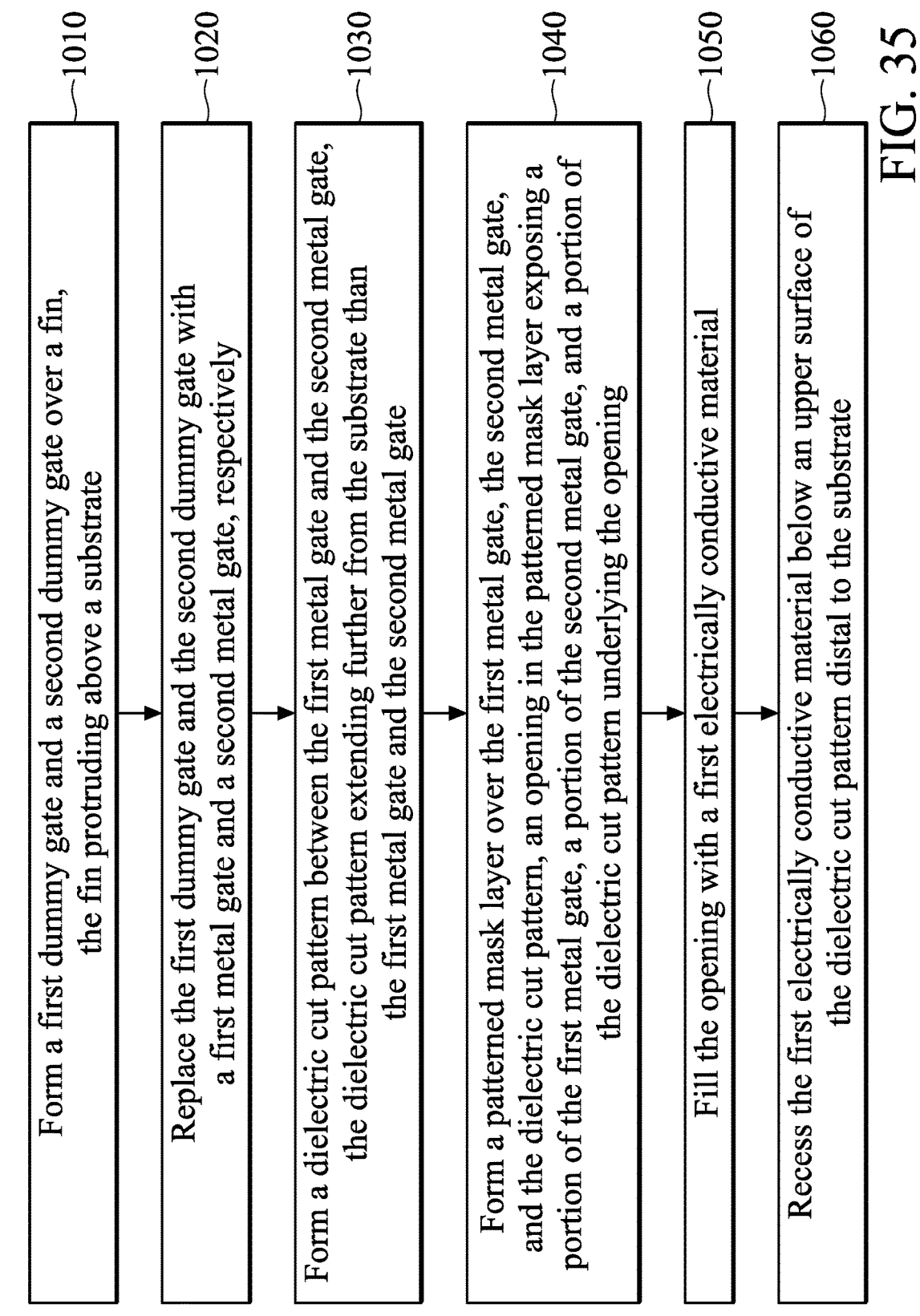

FIN FIELD-EFFECT TRANSISTOR DEVICE AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-7, 8A-8C, 9, 10A-10C, 11A-11C, 12A-12C, 13A-13C, 14A-14C, 15A-15C, 16A-16C, 17A-17C, and 18A-18C illustrate various views (e.g., cross-sectional view, plan view) of a FinFET device at various stages of fabrication, in accordance with an embodiment.

FIGS. 21A and 21B illustrate cross-sectional views of a FinFET device, in accordance with an embodiment.

FIGS. 22A and 22B illustrate cross-sectional views of a FinFET device, in accordance with an embodiment.

FIGS. 23A and 23B illustrate cross-sectional views of a FinFET device, in accordance with an embodiment.

FIGS. 24A and 24B illustrate cross-sectional views of a FinFET device, in accordance with an embodiment.

FIGS. 29A and 29B illustrate cross-sectional views of a FinFET device, in accordance with an embodiment.

FIGS. 30A and 30B illustrate cross-sectional views of a FinFET device, in accordance with an embodiment.

FIGS. 32A and 32B illustrate cross-sectional views of a FinFET device, in accordance with an embodiment.

FIGS. 33A and 33B illustrate cross-sectional views of a FinFET device, in accordance with an embodiment.

FIGS. 34A and 34B illustrate cross-sectional views of a FinFET device, in accordance with an embodiment.

FIG. 35 illustrates a flow chart of a method of fabricating a semiconductor device, in accordance with some embodiments.

DETAILED DESCRIPTION

Figure 1:
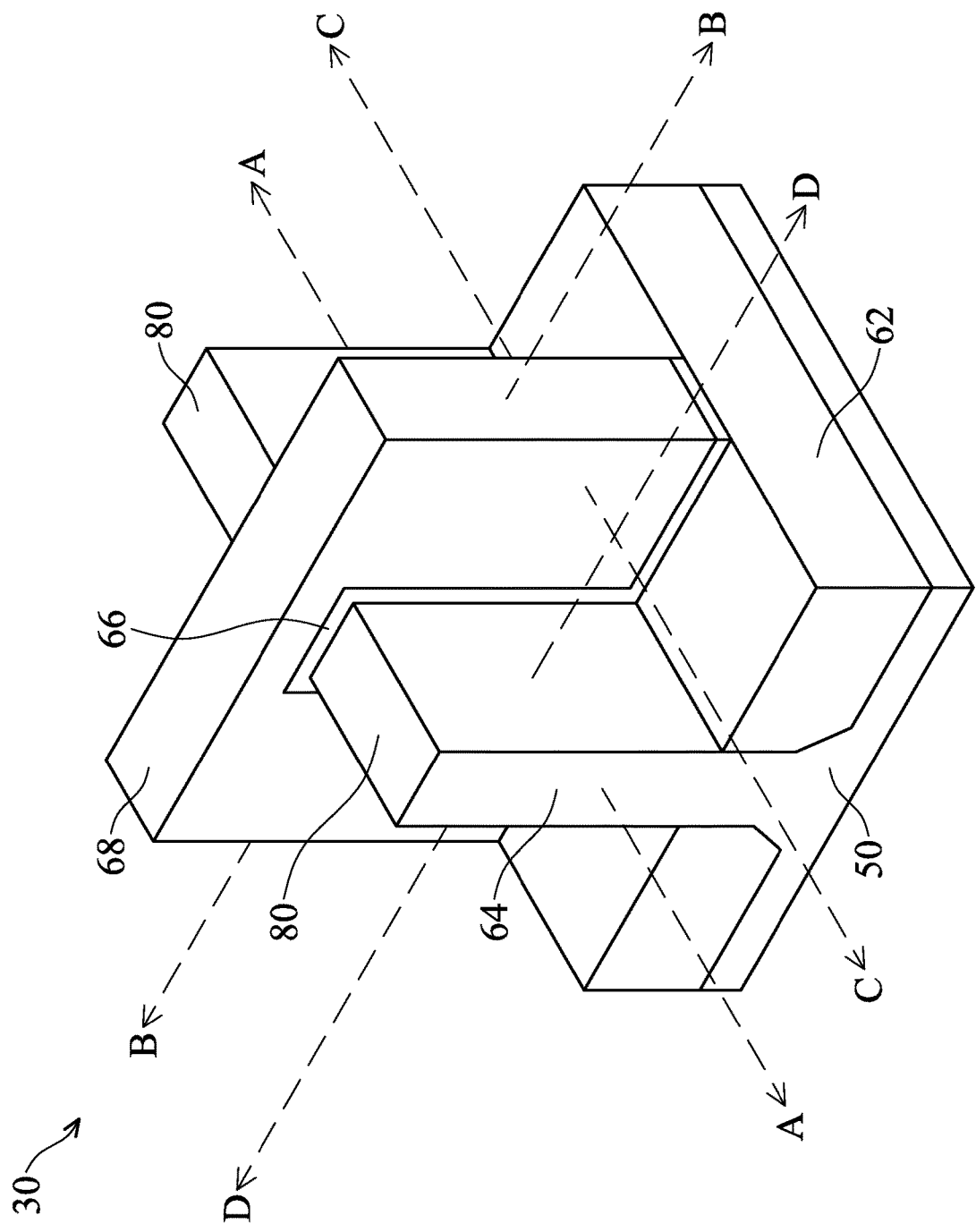
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numeral in different figures refer to the same or similar element formed by a same or similar formation method using a same or similar material(s).

Embodiments of the present disclosure are discussed in the context of forming a semiconductor device, and in particular, in the context of forming a Fin Field-Effect Transistor (FinFET) device. In some embodiments, a first metal gate and second metal gate are formed over a plurality of fins in a gate-last process. A dielectric cut pattern is formed between the first metal gate and the second metal gate, and is spaced apart from the fins. Next, an interlayer dielectric (ILD) layer around the first metal gate and the second metal gate is removed, and a first electrically conductive material is formed between the first metal gate and the second metal gate. The dielectric cut pattern separates the first electrically conductive material into a first portion and a second portion. Next, a patterned mask layer is formed over the first metal gate, the second metal gate, the dielectric cut pattern, and the first electrically conductive material. An opening in the patterned mask layer exposes a portion of the first metal gate, a portion of the second metal gate, and a portion of the dielectric cut pattern. Next, the opening is filled with a second electrically conductive material, and the second electrically conductive material is recessed such that an upper surface of the second electrically conductive material is closer to the substrate than an upper surface of the dielectric cut pattern. The dielectric cut pattern therefore separates the second electrically conductive material into a first gate contact and a second gate contact in a self-aligned manner.

FIG. 1 illustrates an example of a FinFET 30 in a perspective view. The FinFET 30 includes a substrate 50 having a fin 64. The substrate 50 has isolation regions 62 formed thereon, and the fin 64 protrudes above and between neighboring isolation regions 62. A gate dielectric 66 is along sidewalls and over a top surface of the fin 64, and a gate electrode 68 is over the gate dielectric 66. Source/drain regions 80 are in the fin on opposite sides of the gate dielectric 66 and gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section A-A and is outside the fin 64. Cross-section D-D is parallel to cross-section B-B and is outside the gate electrode 68, e.g., through the source/drain region 80. Cross-sections A-A, B-B, C-C, and D-D are also illustrated in the plan view of FIG. 9. Subsequent figures refer to these reference cross-sections for clarity.

Figure 6:
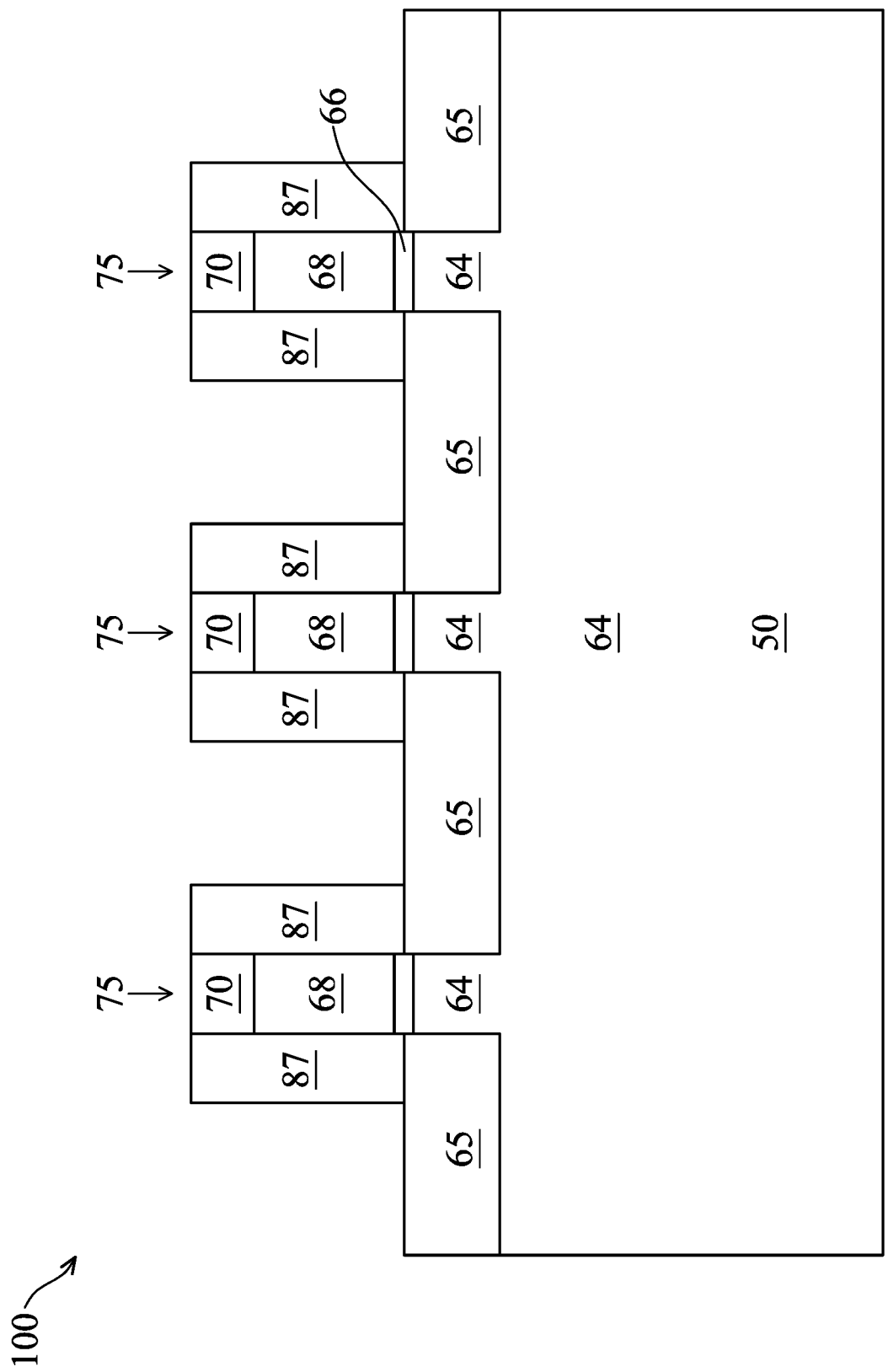
Figure 7:
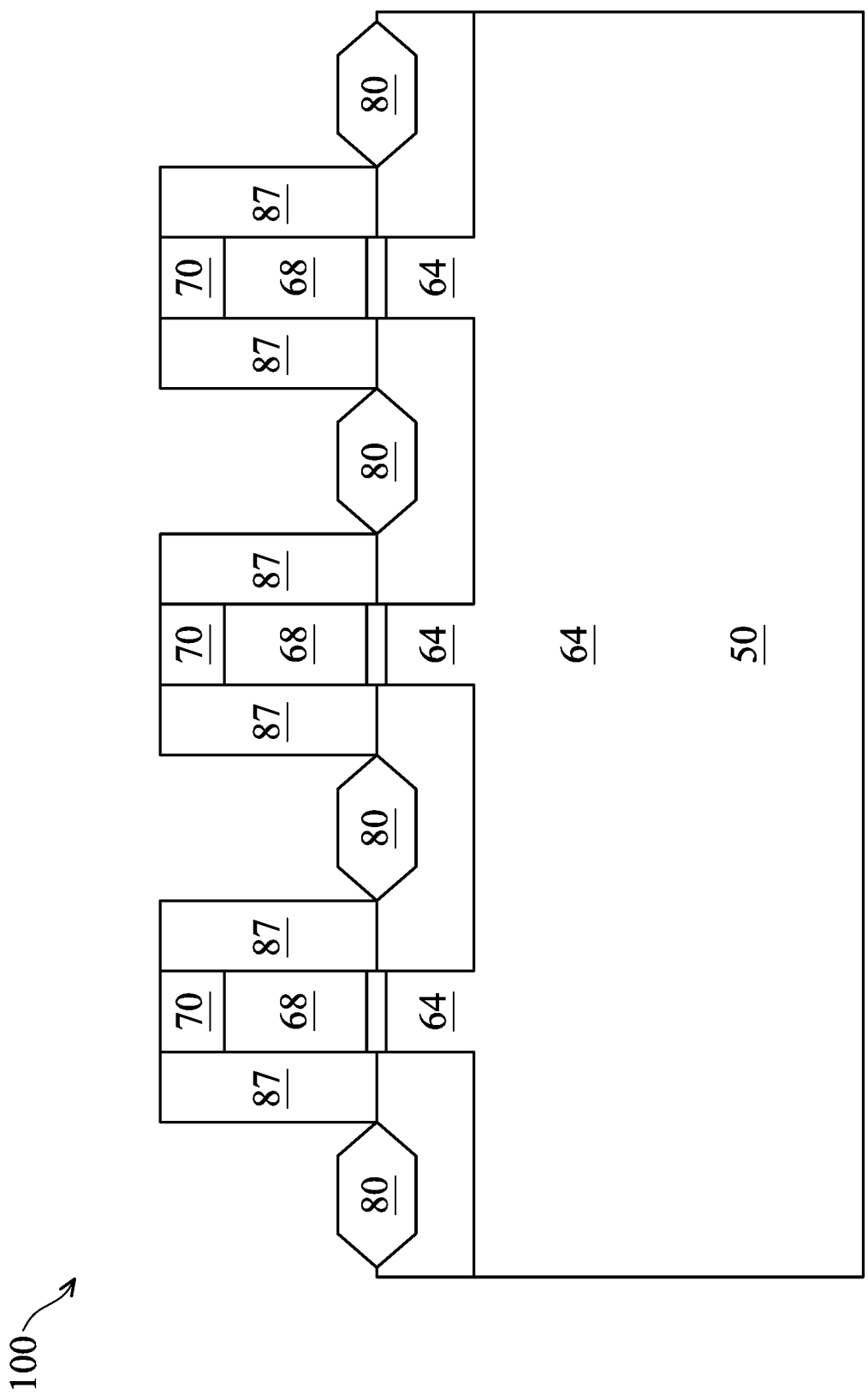
Figure 8A:
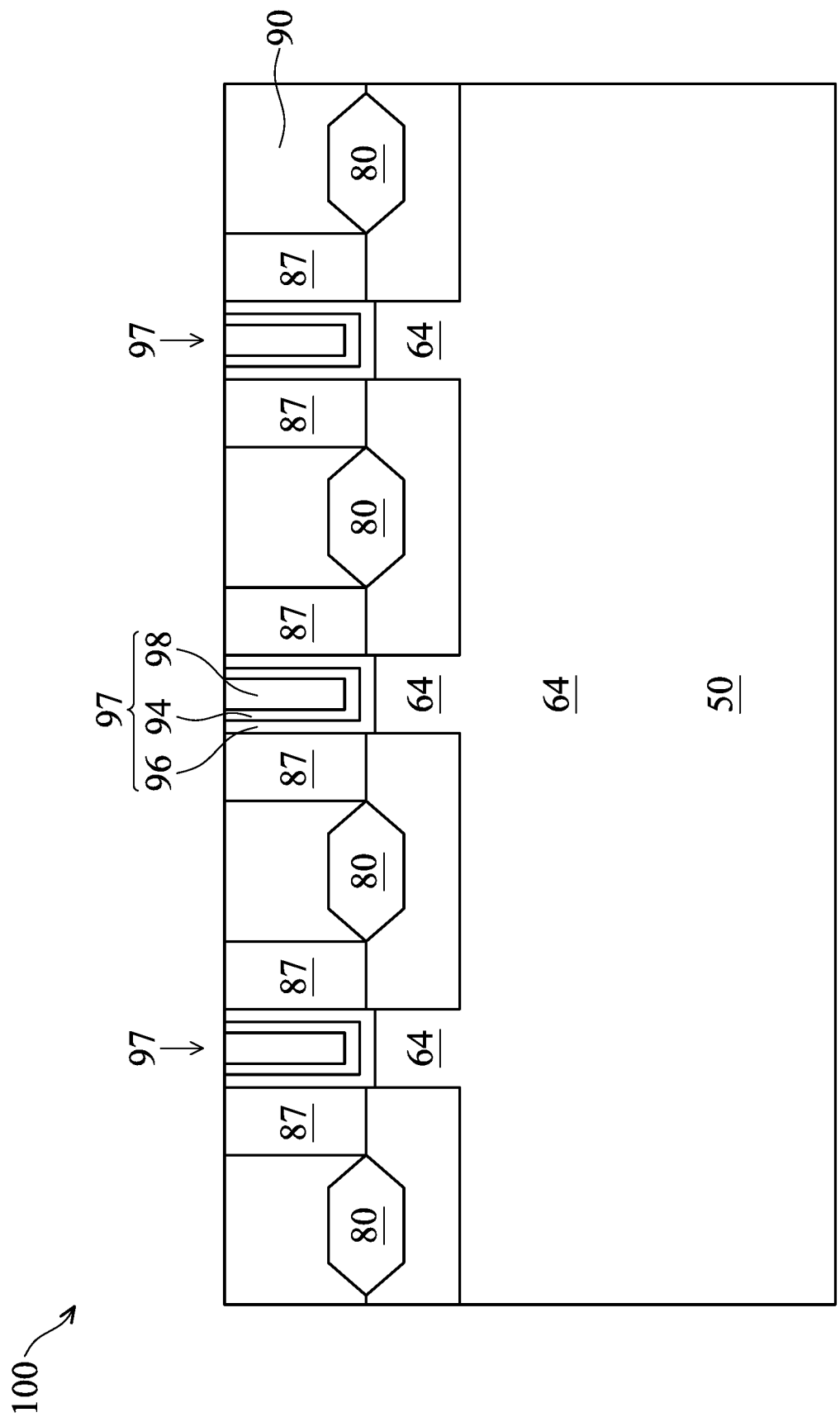
Figure 8B:
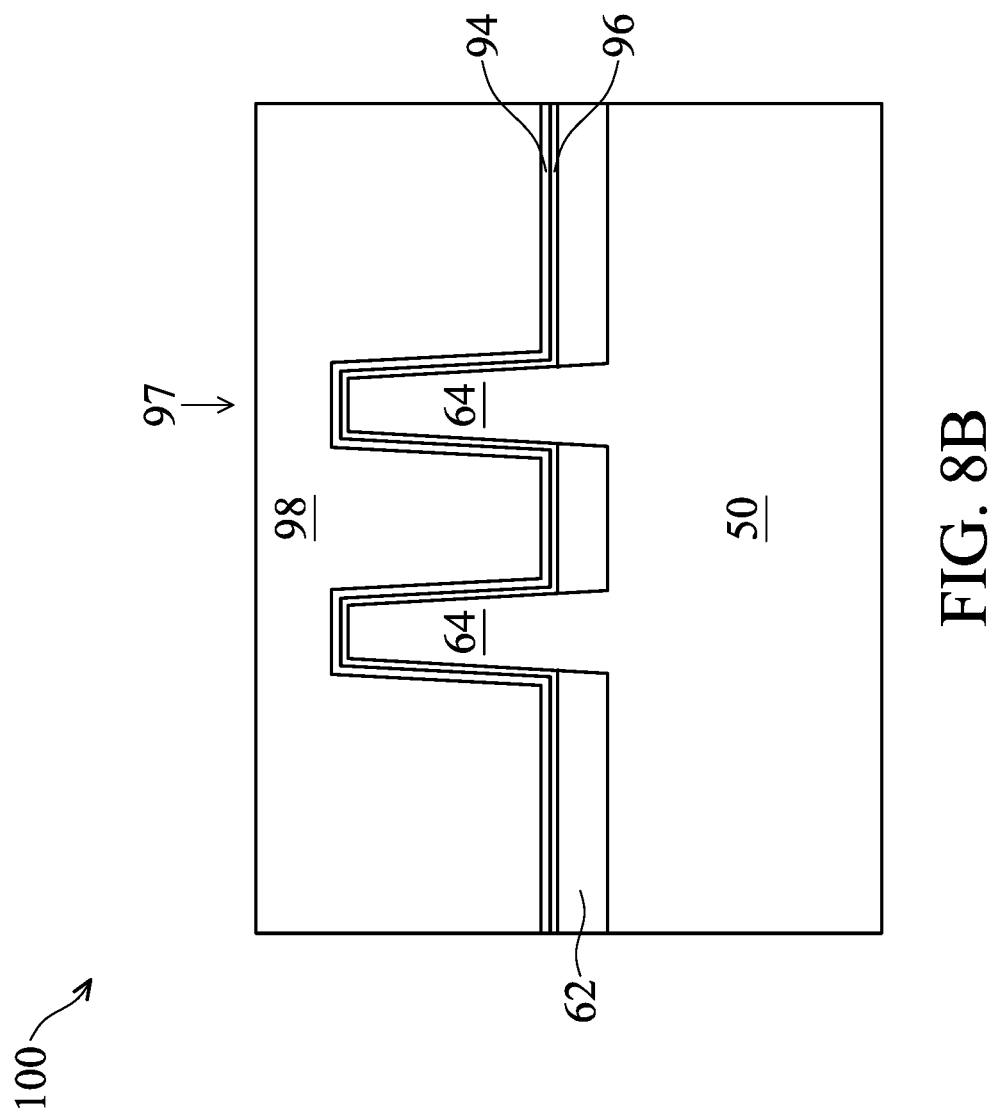
Figure 8C:
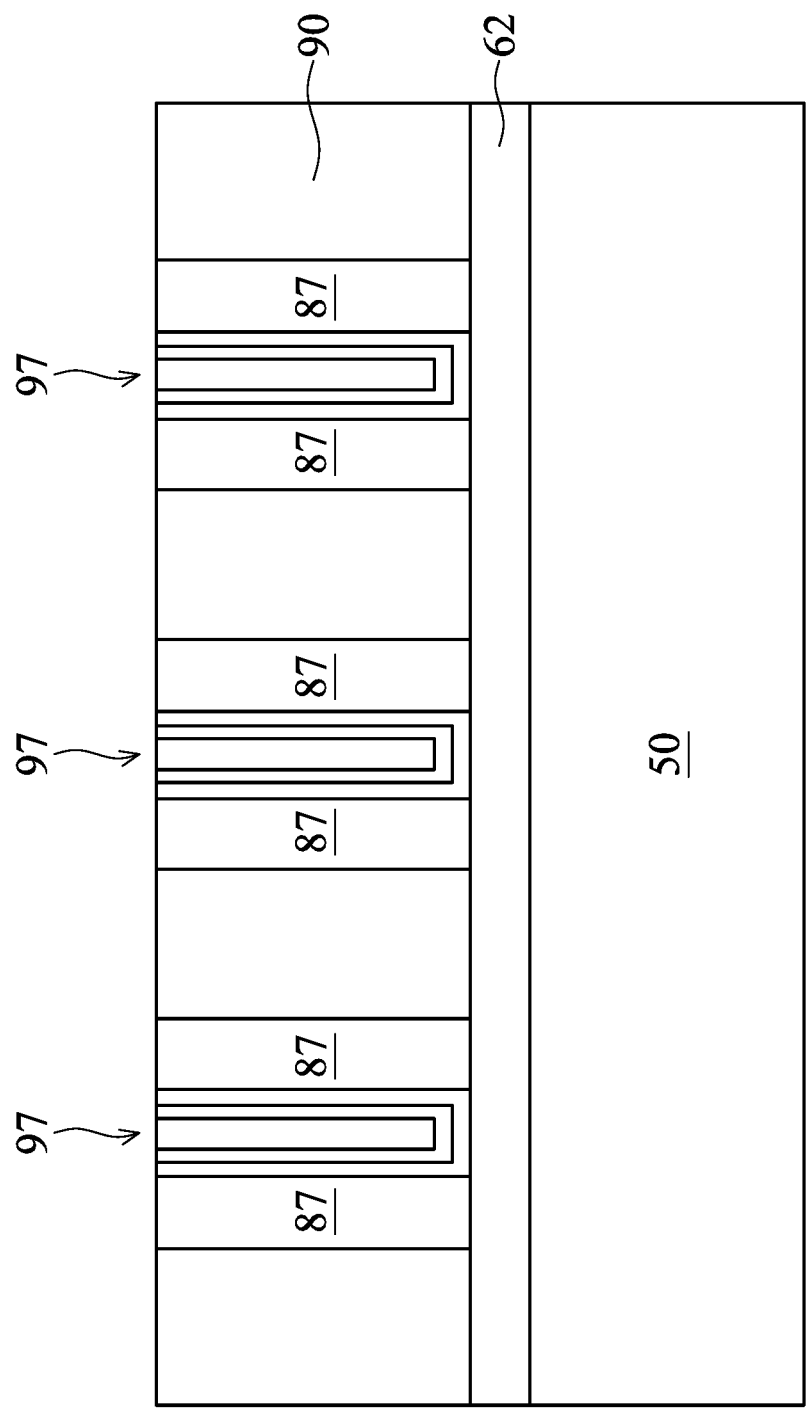
Figure 9:
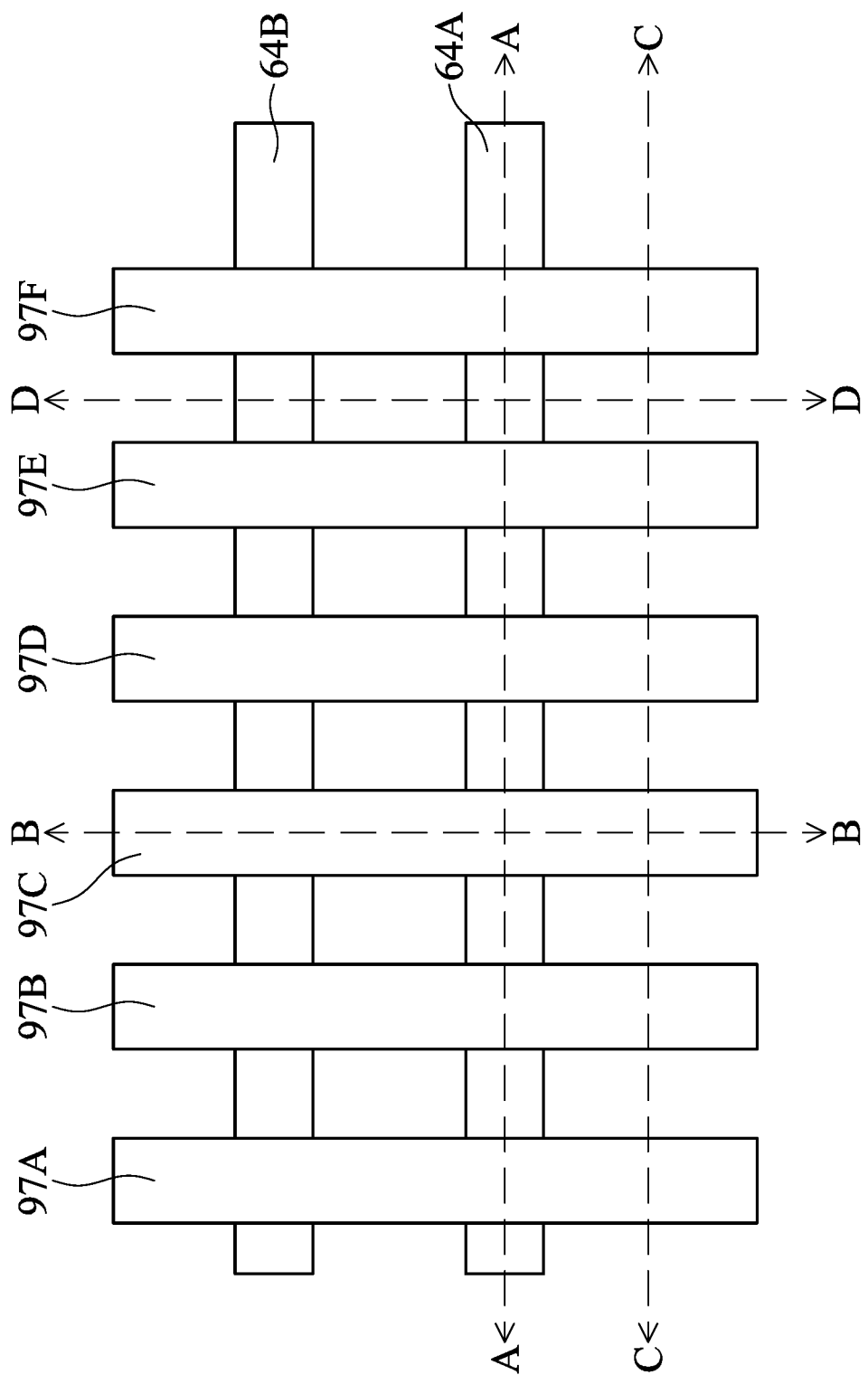

FIGS. 2-7, 8A-8C, 9, 10A-10C, 11A-11C, 12A-12C, 13A-13C, 14A-14C, 15A-15C, 16A-16C, 17A-17C, and 18A-18C illustrate various views (e.g., cross-sectional view, plan view) of a FinFET device 100 at various stages of fabrication, in accordance with an embodiment. The FinFET device 100 is similar to the FinFET 30 in FIG. 1, except for multiple fins and multiple gate structures. FIGS. 2-5 illustrate cross-sectional views of the FinFET device 100 along cross-section B-B, and FIGS. 6 and 7 illustrate cross-sectional views of the FinFET device 100 along cross-section A-A. FIGS. 8A, 8B and 8C illustrate cross-sectional views of the FinFET device 100 along cross-section A-A, B-B and C-C, respectively. FIG. 9 is a plan view of the FinFET device 100. FIGS. 10A-18C illustrate cross-sectional views of the FinFET device 100 along different cross-sections at various stages of fabrication, where figures with the same numerals (e.g., 10A, 10B, and 10C) illustrate cross-sectional views of the FinFET device 100 at a same stage of processing. In particular, FIGS. 10A, 11A, 12A, 13A, 14A, 15A, 16A, 17A, and 18A illustrate top views of the FinFET device 100, FIGS. 10B, 11B, 12B, 13B, 14B, 15B, 16B, 17B, and 18B illustrate cross-sectional views of the FinFET device 100 along cross-section C-C of the respective top view, and FIGS. 10C, 11C, 12C, 13C, 14C, 15C, 16C, 17C, and 18C illustrate cross-sectional views of the FinFET device 100 along cross-section D-D of the respective top view. Note for that clarity, some Figures may show only a portion of the FinFET device 100, and not all features of the FinFET device 100 are illustrated in the Figures.

Figure 2:
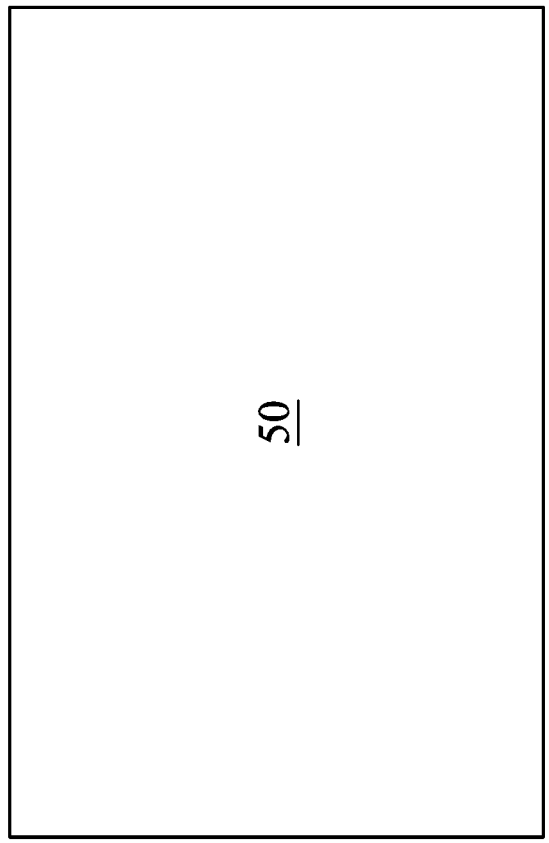

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
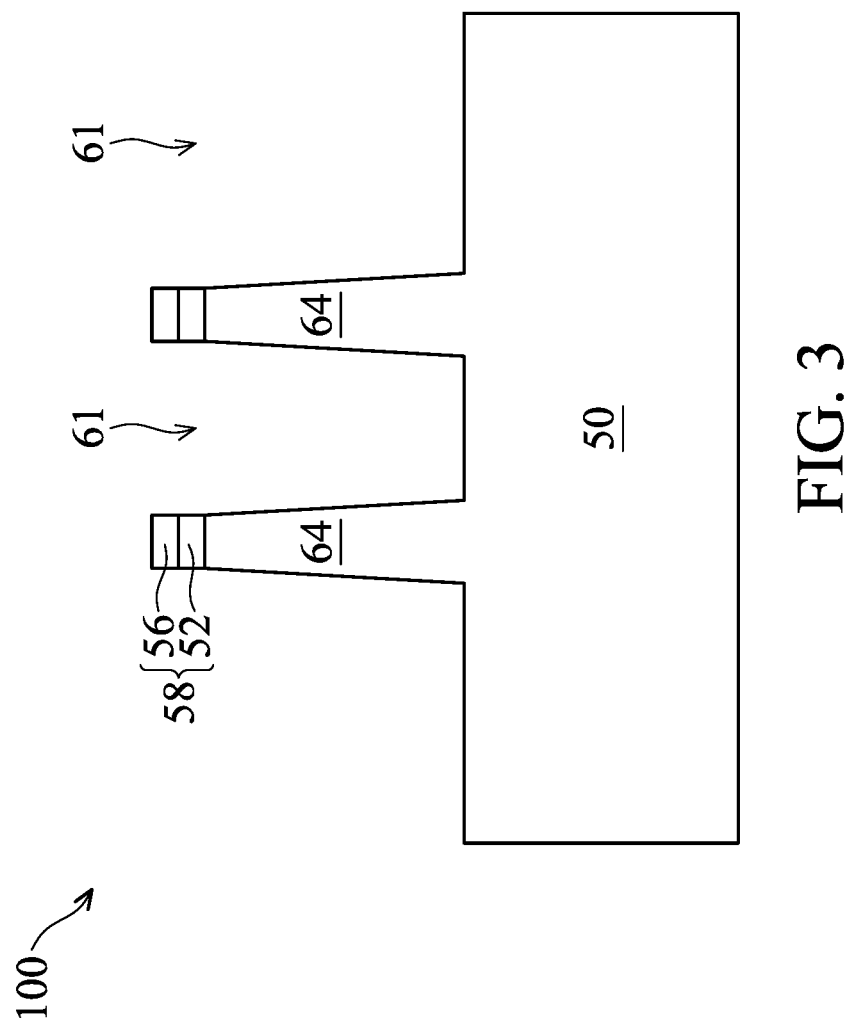

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (also referred to as fins 64) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. After semiconductor fins 64 are formed, the patterned mask 58 may be removed by etching or any suitable method.

Figure 4:
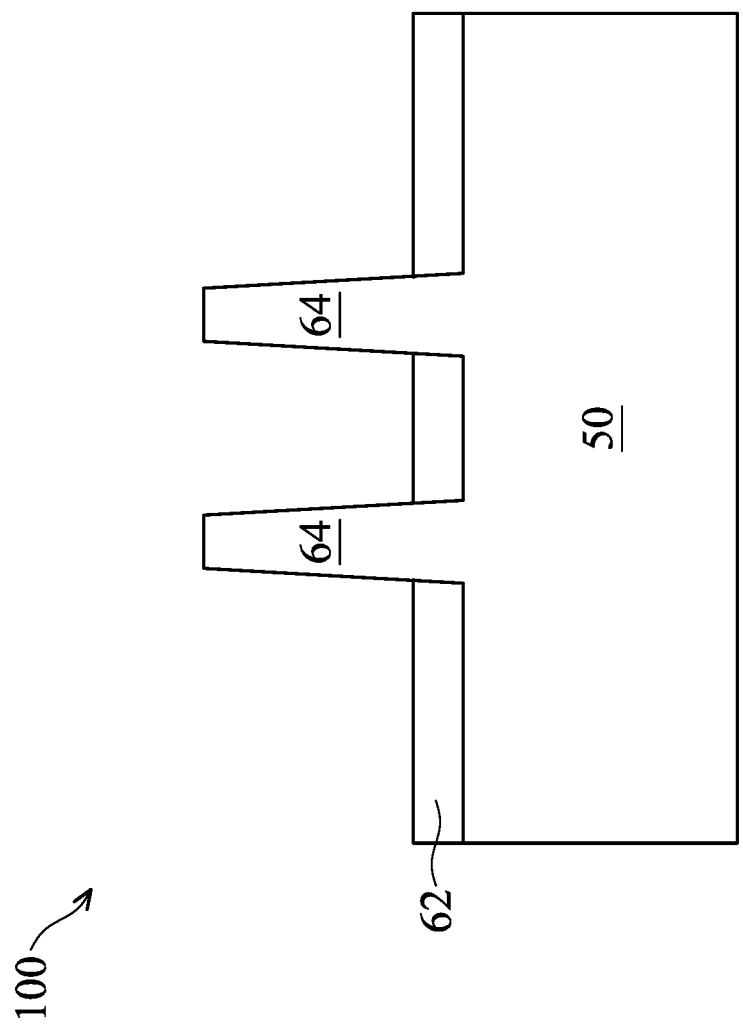

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material (and, if present, the patterned mask 58) and form top surfaces of the isolation regions 62 and top surfaces of the semiconductor fins 64 that are coplanar.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50/semiconductor fins 64 and the isolation region 62. The liner oxide (e.g., silicon oxide) may be a thermal oxide formed through a thermal oxidation of a surface layer of substrate 50/semiconductor fins 64, although other suitable method may also be used to form the liner oxide.

Next, the isolation regions 62 are recessed to form shallow trench isolation (STI) regions. The isolation regions 62 are recessed such that the upper portions of the semiconductor fins 64 protrude above upper surfaces of the isolation regions 62. The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor fins can be recessed, and a material different from the semiconductor fins may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
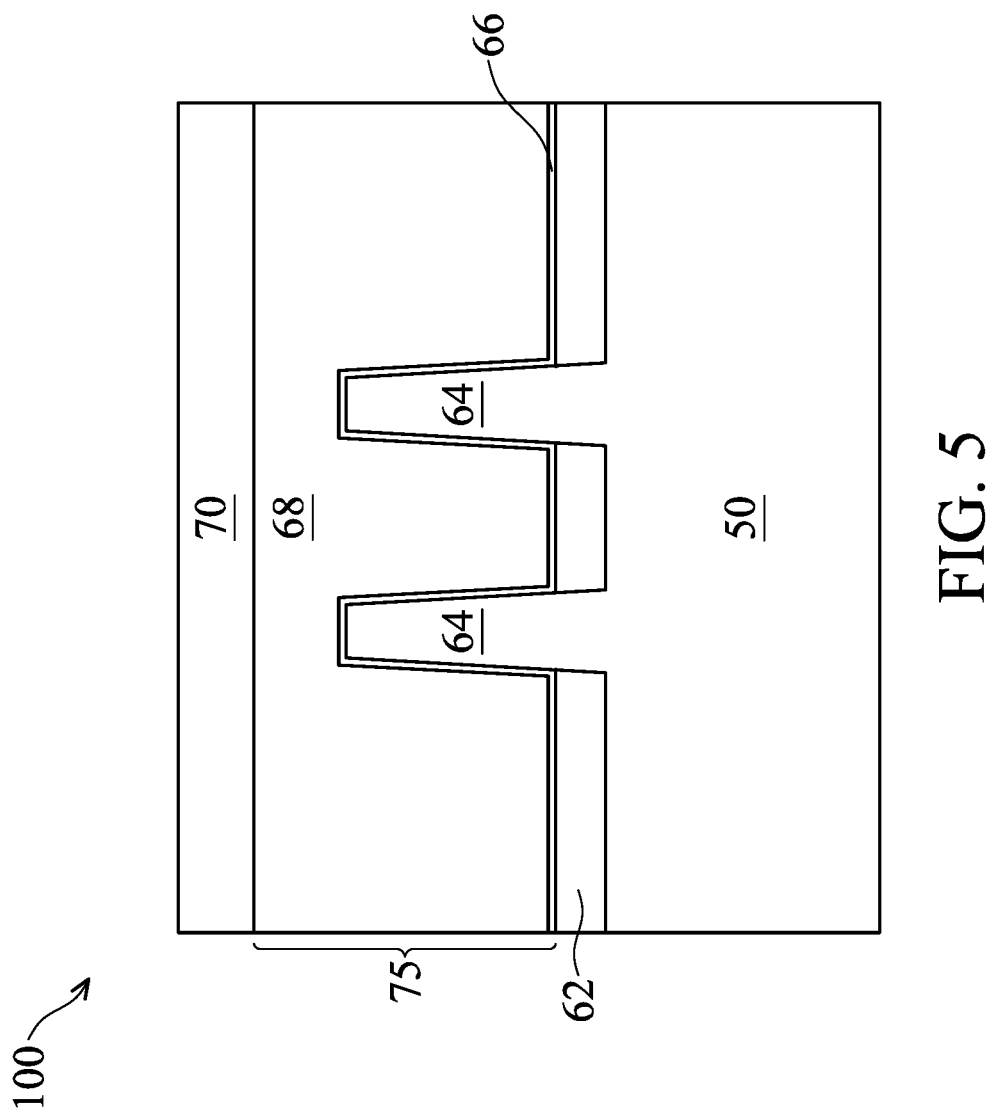

FIG. 5 illustrates the formation of a dummy gate structure 75 over the semiconductor fins 64. The dummy gate structure 75 includes a gate dielectric 66 and a gate electrode 68, in some embodiments. FIG. 5 further illustrates a mask 70 over the dummy gate structure 75. The dummy gate structure 75 may be formed by patterning a mask layer, a gate layer and a gate dielectric layer, where the mask layer, the gate layer and the gate dielectric layer comprise a same material as the mask 70, the gate electrode 68, and the gate dielectric 66, respectively. To form the dummy gate structure 75, the gate dielectric layer is formed on the semiconductor fins 64 and the isolation regions 62. The gate dielectric layer may be, for example, silicon oxide, silicon nitride, multi-layers thereof, or the like, and may be deposited or thermally grown according to acceptable techniques. The formation methods of the gate dielectric layer may include molecular-beam deposition (MBD), atomic layer deposition (ALD), plasma-enhanced CVD (PECVD), and the like.

The gate layer is formed over the gate dielectric layer, and the mask layer is formed over the gate layer. The gate layer may be deposited over the gate dielectric layer and then planarized, such as by a CMP process. The mask layer may be deposited over the gate layer. The gate layer may be formed of, for example, polysilicon, although other materials may also be used. The mask layer may be formed of, for example, silicon nitride or the like.

After the gate dielectric layer, the gate layer, and the mask layer are formed, the mask layer may be patterned using acceptable photolithography and etching techniques to form the mask 70. The pattern of the mask 70 then may be transferred to the gate layer and the gate dielectric layer by a suitable etching technique to form the gate electrode 68 and the gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64. Although one dummy gate structure 75 is illustrated in the cross-sectional view of FIG. 5, more than one dummy gate structures 75 may be formed over the semiconductor fins 64. For example, the plan view in FIG. 9 illustrates multiple metal gates 97 (which replace the dummy gate structures in subsequent processing) over the semiconductor fins 64.

FIGS. 6-8A illustrate the cross-section views of further processing of the FinFET device 100 along cross-section A-A (along a longitudinal axis of the fin). As illustrated in FIG. 6, lightly doped drain (LDD) regions 65 are formed in the fins 64. The LDD regions 65 may be formed by an implantation process. The implantation process may implant N-type or P-type impurities in the fins 64 to form the LDD regions 65. In some embodiments, the LDD regions 65 abut the channel region of the FinFET device 100. Portions of the LDD regions 65 may extend under the gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6, after the LDD regions 65 are formed, gate spacers 87 are formed on the gate structure. In the example of FIG. 6, the gate spacers 87 are formed on opposing sidewalls of the gate electrode 68 and on opposing sidewalls of the gate dielectric 66. The gate spacers 87 may be formed of a nitride, such as silicon nitride, silicon oxynitride, silicon carbonitride, the like, or a combination thereof, and may be formed using, e.g., a thermal oxidation, CVD, or other suitable deposition process. The gate spacers 87 may also extend over the upper surface of the semiconductor fins 64 and the upper surface of the isolation region 62.

The shapes and formation methods of the gate spacers 87 as illustrated in FIG. 6 are merely non-limiting examples, and other shapes and formation methods are possible. For example, the gate spacers 87 may include first gate spacers (not shown) and second gate spacers (not shown). The first gate spacers may be formed on opposing sidewalls of the dummy gate structure 75. The second gate spacers may be formed on the first gate spacers, with the first gate spacers disposed between a respective dummy gate structure 75 and the respective second gate spacers. The first gate spacers may have an L-shape in a cross-sectional view. As another example, the gate spacers 87 may be formed after the epitaxial source/drain regions 80 (see FIG. 7) are formed. In some embodiments, dummy gate spacers are formed on the first gate spacers (not shown) before the epitaxial process of the epitaxial source/drain regions 80 illustrated in FIG. 7, and the dummy gate spacers are removed and replaced with the second gate spacers after the epitaxial source/drain regions 80 are formed. All such embodiments are fully intended to be included in the scope of the present disclosure.

Next, as illustrated in FIG. 7, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 of adjacent fins 64 do not merge together and remain separate source/drain regions 80. In some example embodiments in which the resulting FinFET is an n-type FinFET, source/drain regions 80 comprise silicon carbide (SiC), silicon phosphorous (SiP), phosphorous-doped silicon carbon (SiCP), or the like. In alternative example embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about 1E19 $cm^{-3}$ to about 1E21 $cm^{-3}$. In some embodiments, the epitaxial source/drain regions may be in situ doped during growth.

Next, as illustrated in FIG. 8A, a first interlayer dielectric (ILD) 90 is formed over the structure illustrated in FIG. 7, and a gate-last process (sometimes referred to as replacement gate process) is performed. In a gate-last process, the gate electrode 68 and the gate dielectric 66 (see FIG. 7) are considered dummy structures and are removed and replaced with an active gate electrode and active gate dielectric. The active gate electrode and active gate dielectric may be collectively referred to as a replacement gate or a metal gate.

In some embodiments, the first ILD 90 is formed of a dielectric material such as silicon oxide (SiO), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to planarize the top surface of the first ILD 90, such that the top surface of the first ILD 90 is level with the top surface of the gate electrode 68 (see FIG. 7) after the CMP process. Therefore, after the CMP process, the top surface of the gate electrode 68 is exposed, in some embodiments.

In accordance with some embodiments, the gate electrode 68 and the gate dielectric 66 directly under the gate electrode 68 are removed in an etching step(s), so that recesses (not shown) are formed. Each recess exposes a channel region of a respective fin 64. Each channel region may be disposed between neighboring pairs of epitaxial source/drain regions 80. During the dummy gate removal, the dummy gate dielectric 66 may be used as an etch stop layer when the dummy gate electrode 68 is etched. The dummy gate dielectric 66 may then be removed after the removal of the dummy gate electrode 68.

Next, metal gates 97 are formed in the recesses by forming a gate dielectric layer 96, a barrier layer 94, and a gate electrode 98 successively in each of the recesses. As illustrated in FIG. 8A, the gate dielectric layer 96 is deposited conformally in the recesses. The barrier layer 94 is formed conformally over the gate dielectric layer 96, and the gate electrode 98 fills the recesses. Although not shown, a work function layer may be formed, e.g., between the gate dielectric layer 96 and the barrier layer 94.

In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

The work function layer may be formed conformally over the gate dielectric layer 96. The work function layer comprises any suitable material for a work function layer. Exemplary p-type work function metals that may be included in the metal gate 97 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the metal gate 97 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a target threshold voltage Vt is achieved in the device that is to be formed in the respective region. The work function layer(s) may be deposited by CVD, PVD, ALD, and/or other suitable process.

Next, the barrier layer 94 is formed conformally over the gate dielectric layer 96 and, if present, over the work function layer. The barrier layer 94 may comprise an electrically conductive material such as titanium nitride, although other materials, such as tantalum nitride, titanium, tantalum, or the like, may alternatively be utilized. The barrier layer 94 may be formed using a CVD process, such as PECVD. However, other alternative processes, such as sputtering or MOCVD, ALD, may alternatively be used.

Next, the gate electrode 98 is formed over the barrier layer 94. The gate electrode 98 may be made of a metal-containing material such as Cu, Al, W, the like, combinations thereof, or multi-layers thereof, and may be formed by, e.g., electroplating, electroless plating, PVD, CVD, or other suitable method. A planarization process, such as a CMP, may be performed to remove the excess portions of the gate dielectric layer 96, the work function layer, the barrier layer 94, and the material of the gate electrode 98, which excess portions are over the top surface of the first ILD 90. The resulting remaining portions of material of the gate electrode 98, the barrier layer 94, the work function layer, and the gate dielectric layer 96 thus form metal gates 97 of the FinFET device 100. Three metal gates 97 are illustrated in the example of FIG. 8A. However, more or less than three metal gates 97 may be used to form the FinFET device 100, as skilled artisans readily appreciate.

FIGS. 8B and 8C illustrate the FinFET device 100 of FIG. 8A, but along cross-section B-B and C-C, respectively. FIG. 8B shows the fins 64 and the metal gate 97 over the fins 64. FIG. 8C illustrates the gate spacers 87 and the metal gates 97 over the STI 62. Note that the fin 64 is not visible in the cross-section of FIG. 8C.

Referring now to FIG. 9, a plan view of the FinFET device 100 after the processing step of FIGS. 8A-8C is illustrated. For simplicity, not all features of the FinFET device 100 are illustrated. For example, the gate spacers 87, the isolation regions 62, and the source/drain regions 80 are not illustrated in FIG. 9.

As illustrated in FIG. 9, the metal gates 97 (e.g., 97A/97B/97C/97D/97E/97F) straddle the semiconductor fins 64 (e.g., 64A/64B). In subsequent processing, a plurality of cut patterns 106 (see, e.g., FIG. 14A-14C) are formed between (or adjacent to) the metal gates 97. The cut patterns 106 will be used to cut (e.g., separate) an electrically conductive material (see 111 in FIGS. 16A-16C) into separate portions, thereby defining electrically connections between different source/drain regions. The cut pattern 106 will also be used to separate an electrically conductive material (see 121 in FIGS. 18A-18C) into separate portions, thereby forming gate contact plugs in a self-aligned manner. Details are discussed hereinafter.

Figure 14A:
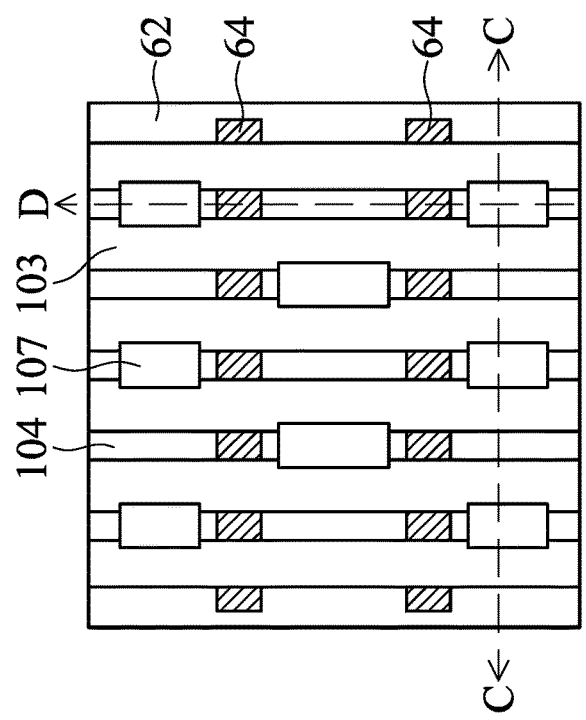

Referring now to FIGS. 10A-10C, FIG. 10A illustrates a top view of the FinFET device 100. The fins 64 are illustrated in phantom in FIG. 10A. The locations of the metal gates 97 (which correspond to the locations of the dielectric layer 103) are not illustrated in FIG. 10A, but illustrated in FIGS. 14A, 15A, 16A, and 18A. FIG. 10B illustrates the cross-sectional view of the FinFET device 100 along cross-section C-C, and FIG. 10C illustrates the cross-sectional view of the FinFET device 100 along cross-section D-D. The locations of the cross-sections C-C and D-D relative to the metal gates 97 are shown in FIG. 14A. Note that for simplicity, details of the metal gates 97 (e.g., the gate electrode 98, the barrier layer 94, and the gate dielectric layer 96) are not illustrated in FIG. 10B and subsequent figures.

As illustrated in FIGS. 10A-10C, the metal gates 97 are recessed below upper surfaces of the gate spacers 87, e.g., by an anisotropic etching process. As a result, recesses are created between the gate spacers 87 by the recessing of the metal gates 97. Top portions of the gate spacers 87 may also be removed by the anisotropic etching process, as illustrated in FIG. 10B. Next, a dielectric layer 103 is formed to fill the recesses between the gate spacers 87. The dielectric layer 103 may comprise a suitable dielectric material such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, SiO, or the like, and may be formed by a suitable formation method such as CVD, PVD, the like, or combinations thereof. The dielectric layer 103 may be formed in a self-aligned manner, and sidewalls of the dielectric layer 103 may be aligned with respectively sidewalls of the gate spacers 87. A planarization process, such as CMP, may be performed to planarize the upper surface of the dielectric layer 103.

After the dielectric layer 103 is formed, a dielectric layer 92, which may be the same as or similar to the first ILD 90, is formed over the first ILD 90 and over the dielectric layer 103, and thereafter, a hard mask layer 101 (e.g., an oxide or a nitride layer) is formed over the dielectric layer 92. In an example embodiment, the first ILD 90 and the dielectric layer 92 are both formed of an oxide (e.g., silicon oxide), and therefore, the first ILD 90 and the dielectric layer 92 may be collectively referred as an oxide 90/92 hereinafter.

FIG. 10C illustrates the cross-sectional view of the FinFET device 100 along cross-section D-D. FIG. 10C shows the fins 64 protruding above the substrate 50 and the STI 62. FIG. 10 C further illustrates the first ILD 90, the dielectric layer 92, and the hard mask layer 101.

Next, in FIGS. 11A-11C, openings 102 are formed in the hard mask layer 101 to pattern the hard mask layer 101. The openings 102 are formed at locations between metal gates 97, and are spaced apart from the fins 64. A suitable method, such as photolithography and etching, may be used to form the openings 102. Once formed, the patterned hard mask layer 101 is used as an etching mask to pattern the dielectric layer 92 and the first ILD 90 using an etching process, such as an isotropic etching process. The etching process removes portions of the dielectric layer 92 and portions of the first ILD 90. As illustrated in FIGS. 11B and 11C, the openings 102 are extended into the first ILD 90, and have slanted sidewalls. For example, a width of the opening 102 may decrease as the opening 102 extends toward the substrate 50. Portions of the STI 62 underlying the openings 102 may be exposed after the etching process. In the example of FIG. 11B, the sidewalls of the dielectric layer 103 and the sidewalls of the gate spacers 87 are exposed by the openings 102.

Next, in FIGS. 12A-12C, a dielectric material 105 is formed to partially fill the openings 102. In some embodiments, the dielectric material 105 comprises SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or the like, and is formed by a suitable formation method such as CVD, PVD, the like, or combinations thereof.

Next, in FIGS. 13A-13C, a dielectric material 107 different (e.g., having a different composition) from the dielectric material 105 is formed over the dielectric material 105 to fill remaining portions of the openings 102. The dielectric material 107 is different (e.g., having a different composition) from the dielectric layer 103 to provide etching selectivity in subsequent processing. In some embodiments, the dielectric material 107 comprises SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or the like, and is formed by a suitable formation method such as CVD, PVD, the like, or combinations thereof. The dielectric material 107 may be formed over the upper surface of the hard mask layer 101. In some embodiments, a planarization process, such as CMP, is performed to remove excess portions of the dielectric material 107 from the upper surface of the hard mask layer 101. In other embodiments, the planarization process is omitted, and the portions of the dielectric material 107 over the upper surface of the hard mask layer 101 are removed with the hard mask layer 101 in subsequent processing.

Figure 14C:
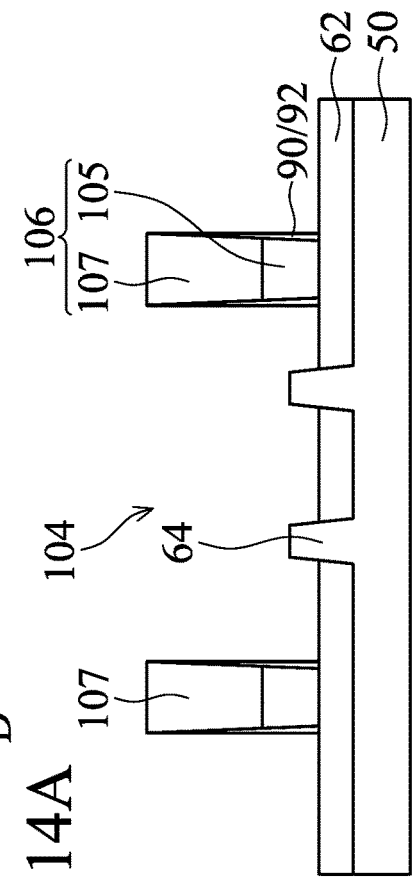
Figure 14B:
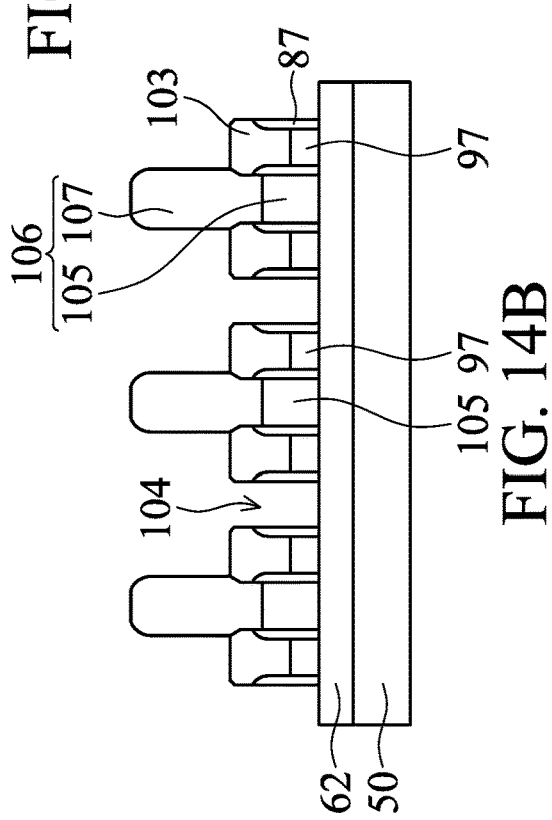

Next, in FIGS. 14A-14C, the hard mask layer 101 and portions of the dielectric material 107 over/in the hard mask layer 101, if any, are removed. In addition, the first ILD 90 and the dielectric layer 92 are also removed, and the fins 64 are exposed. Removal of the hard mask layer 101, portions of the dielectric material 107, the first ILD 90, and the dielectric layer 92 is performed by one or more suitable etching processes, such as a CMP process, a dry etch process (e.g., a plasma process), a wet etch process, the like, or combinations thereof. For example, a CMP process may be performed first to remove the hard mask layer 101 and portions of the dielectric material 107 over/in the hard mask layer 101. Next, an etching process (e.g., a dry etch or a wet etch) using an etchant that is selective to (e.g., having a higher etch rate for) the materials of the first ILD 90 and the dielectric layer 92 may be performed to remove the first ILD 90 and the dielectric layer 92.

In the example of FIG. 14A-14C, each of the metal gates 97 is directly under respective portions of the dielectric layer 103. Therefore, in the top view of FIG. 14A, each metal gate 97, with the respective gate spacers 87, has a same boundary as the respective portion of the dielectric layer 103. As a result, locations of the dielectric layer 103 in the top views (e.g., FIGS. 14A, 15A, 16A, and 18A) correspond to locations of the metal gates 97. FIG. 14A therefore shows that each of the metal gates 97 extends continuously over the illustrated fins 64.

After the dielectric layer 92 and the first ILD 90 are removed, openings 104 (e.g., trenches) are formed between adjacent metal gate 97. The openings 104 expose sidewalls of the gate spacers 87 that face away from the respective metal gate 97, and expose sidewalls of the dielectric layer 103. The fins 64 are also exposed. In the discussion hereinafter, the dielectric material 105 and the overlying dielectric material 107 that are in the same opening 102 (see FIGS. 12A-12C) are collectively referred to as a cut pattern 106, or a dielectric cut pattern 106. For example, FIG. 14A illustrates eight cut patterns 106.

FIG. 14C illustrates tapered sidewalls of the cut patterns 106, which are formed due to the tapered sidewalls of the openings 102 (see FIGS. 12B and 12C), in some embodiments. FIG. 14C further illustrates residue portions of the oxide 90/92 that are along the tapered sidewalls of the cut patterns 106.

Next, in FIGS. 15A-15C, a liner 109 is formed along sidewalls of the structure shown in FIGS. 14A-14C. The liner 109 may be formed by forming a conformal liner layer (e.g., a dielectric layer) over the structure shown in FIGS. 14A-14C, followed by an anisotropic etch to remove horizontal portions of the liner layer. The liner 109 is formed of a dielectric material, such as SiC, LaO, AlO, AlON, ZrO, HfO, SiN, ZnO, ZrN, ZrAlO, TiO, TaO, YO, TaCN, ZrSi, SiOCN, SiOC, SiCN, HfSi, SiO, or the like, in some embodiments. In other embodiments, the liner 109 is omitted.

Next, in FIGS. 16A-16C, an electrically conductive material 111, such as Cu, W, Al, Co, the like, or combinations thereof, is formed in the openings 104 (e.g., trenches, see FIGS. 15A-15C). Although not illustrated, a barrier layer may be formed conformally along sidewalls and the bottom of the openings 104 before the electrically conductive material 111 is formed. The barrier layer may comprise TiN, TaN, Ti, Ta, or the like, and may be formed using, e.g., PECVD, sputtering, MOCVD, ALD, or the like. Next, a planarization process, such as CMP, is performed to achieve a coplanar upper surface between the electrically conductive material 111 and the dielectric materials 103/107. Note that the planarization process may remove at least upper portions of the dielectric material 107. After the planarization process, a height T1 of the dielectric material 105 is between about 2 nm and about 100 nm, and a height T2 of the dielectric material 107 is between about 0 nm and about 100 nm. An upper surface 106U of the cut pattern 106 is higher (further from the substrate 50) than the upper surface of the metal gate 97. A thickness T4 of the liner 109 is between about 0 nm and about 20 nm. Note that the cut patterns 106 separates the electrically conductive material 111 into separate portions (e.g., discrete, non-continuous portions). These separate portions define different electrical connections between the source/drain regions disposed over different fins 64. For example, by defining different locations of the cut patterns 106, different electrical connections of the source/drain regions may be achieved.

As feature size continues to shrink in advanced processing nodes, it becomes increasingly challenging to form the cut patterns 106. To appreciate the advantage of the present disclosure, consider a reference method where cut patterns are formed by simply patterning the first ILD 90 and the dielectric layer 92 using a patterned hard mask layer 101' (not shown), where the pattern hard mask layer 101' is the complementary of the pattern hard mask layer 101 of FIG. 12A. In other words, the pattern hard mask layer 101' comprises small, separate rectangular pieces (e.g., eight pieces) disposed at the locations of the openings 102 in FIG. 12A. However, these small, separate rectangular pieces of patterned hard mask layer 101' may peel off during the patterning process to form the cut patterns, thereby failing to form the correct cut patterns underneath the patterned hard mask layer 101', which may result in short circuit of the different portions of the electrically conductive material 111 in subsequent processing.

In contrast, the presently disclosed method avoids the peel-off problem of the reference method, and therefore, the cut patterns 106 are formed correctly. The size and the materials of the cut patterns 106 ensure that the cut patterns 106 are strong enough to survive the subsequent processing. For example, compared with the reference method discussed above, where a cut pattern is formed by patterning the first ILD 90 and the dielectric layer 92 using the patterned hard mask layer 101', the presently disclosed cut pattern 106 is thicker, and therefore, can better withstand the subsequent processing (e.g., etching), thereby reducing or avoiding the peel-off problem. In addition, the material(s) of the cut patterns 106 in the present disclosure have better physical properties than the material of the oxide 90/92 (e.g., silicon oxide). For instance, the material(s) of the cut patterns 106 may be denser, less porous, and/or more resistant to etching (e.g., having slower etch rate). The better physical properties help to prevent the cut patterns 106 from being damaged during the etching process to remove the first ILD 90 and the dielectric layer 92 as illustrated in FIGS. 14A-14C, thus avoiding the short circuit issue discussed above. In addition, the better physical properties of the materials of the cut patterns 106 improve the time-dependent dielectric breakdown (TDDB) performance between adjacent source/drain regions.

Figure 17A:
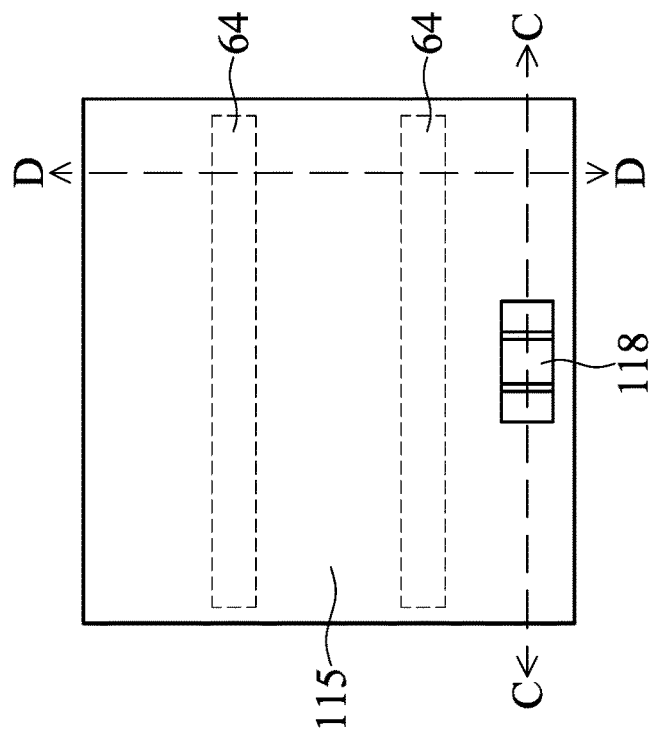
Figure 17C:
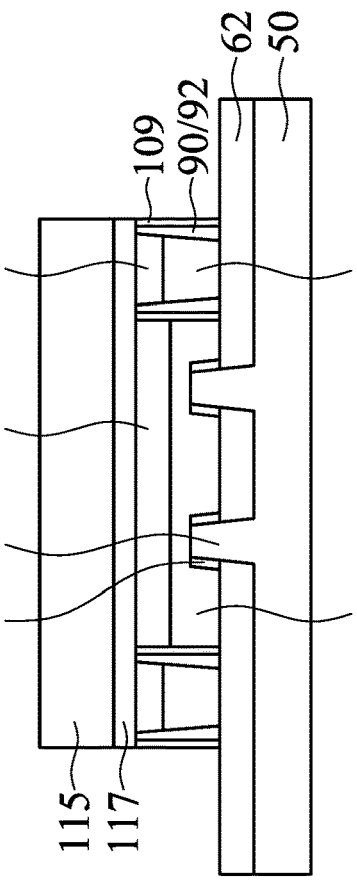
Figure 17B:
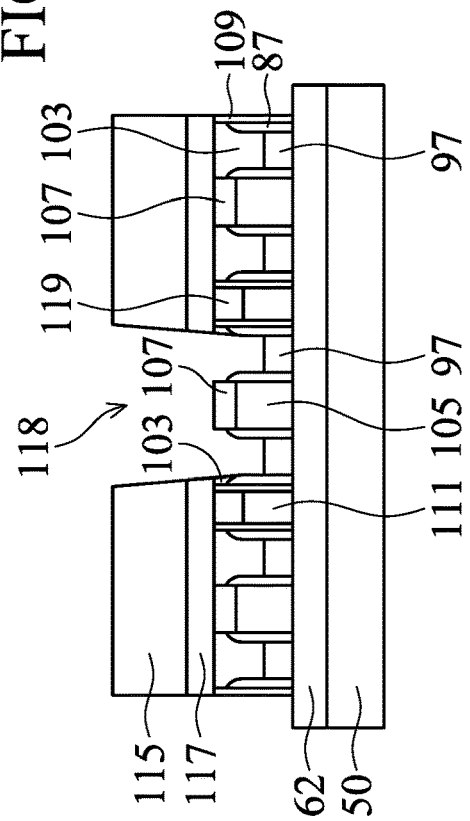

Next, in FIGS. 17A-17C, the electrically conductive material 111 is etched back (e.g., recessed), and a dielectric layer 119 is formed over the (recessed) electrically conductive material 111. In some embodiments, the dielectric layer 119 is the same (e.g., having a same composition) as the dielectric material 105 and the dielectric layer 103, and the dielectric material 107 is different (e.g., having a different composition) from the dielectric material 105 and the dielectric layer 103. In some embodiments, the dielectric layer 119 comprises SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, SiO, or the like, and is formed by a suitable formation method such as CVD, PVD, the like, or combinations thereof. A planarization process may be performed after the dielectric layer 119 is formed such that the upper surface of the dielectric layer 119 is level with the upper surface of the dielectric layer 103.

Next, an etch stop layer 117 is formed over the cut patterns 106, the dielectric layer 119, and the metal gates 97, and a mask layer 115 is formed over the etch stop layer 117. The etch stop layer 117 may comprise a suitable material such as silicon nitride, silicon carbide, silicon carbonitride, or the like, and may be formed by PVD, CVD, sputtering, or the like. The mask layer 115 may be, e.g., an oxide, and may be formed by any suitable method.

Next, an opening 118 is formed in the mask layer 115, e.g., using photolithography and etching techniques. The opening 118 may be extended through the etch stop layer 117. Next, an anisotropic etching process is performed using the patterned mask layer 115 as an etching mask to remove portions of the dielectric layer 103, such that the cut pattern 106 and the metal gates 97 directly under the opening 118 are exposed. Note that due to the etch selectivity between the dielectric material 107 and the dielectric layer 103, the etching process removes the dielectric layer 103 without substantially attacking the dielectric material 107. In the example of FIG. 17B, residue portions of the dielectric layer 103 is left at the sidewall of the opening 118 between the gate spacers 87 and the etch stop layer 117.

Note that the opening 118 exposes a cut pattern 106, and metal gates 97 on opposing sides of the cut pattern 106. The upper surface of the cut pattern 106 is higher (e.g., further from the substrate 50) than the upper surface of the metal gate 97. In the example of FIG. 17A-17C, the cut pattern 106 includes two different dielectric materials, e.g., an upper layer formed of the dielectric material 107 and a lower layer formed of the dielectric material 105. The bi-layered structure of the cut pattern 106 provides flexibility in the choice of the dielectric materials. For example, the dielectric material 107 may be chosen to provide etching selectivity between the dielectric material 107 and the dielectric layer 103 during the formation of the opening 118, and the dielectric material 105 may be chosen to offer better TDDB performance between adjacent source/drain regions. The dual-layered structure of the cut pattern 106, however, may require more processing steps and may be more costly to form than a single-layered cut pattern 106 (see, e.g., 106 in FIGS. 27A-27B), where the cut pattern 106 is formed of a single dielectric material. The choice of the dielectric materials for the single-layered cut pattern 106, however, may be more limited than the dual-layered cut pattern 106, because the dielectric material of the single-layered cut pattern 106 should provide both good TDDB performance (e.g., between adjacent source/drain regions) and the etching selectivity over the dielectric layer 103.

Next, in FIGS. 18A-18C, an electrically conductive material 121 (e.g., Cu, W, Al, Co, or the like) is formed in the opening 118. The electrically conductive material 121 fills the opening 118, and may be formed over the upper surface of the mask layer 115. Next, the mask layer 115, the etch stop layer 117, and excess portions of the electrically conductive material 121 disposed over the upper surface of the cut pattern 106 are removed, e.g., by a CMP process, a dry etch, a wet etch, combination thereof, or the like. As illustrated in FIG. 18B, a coplanar upper surface is achieved between the dielectric material 107, the electrically conductive material 121, the dielectric layer 119, and the dielectric layer 103. Note that the cut pattern 106 separates the electrically conductive material 121 into two separate gate contacts 121 (also referred to as gate contact plugs), with each gate contact 121 being connected to a respective underlying metal gate 97.

Note that the width of the opening 118 (see FIG. 17A-17C) is larger than the width of each of the gate contact 121, and the gate contacts 121 are formed in a self-aligned manner using the cut pattern 106. This illustrates another advantage of the present disclosure. As feature sizes continue to shrink in advanced processing nodes, the resolution of the conventional photolithography may not be enough to form separate opening for each of the gate contacts 121. The disclosed methods allows a larger opening (e.g., 118) to be formed using the conventional photolithography, and the smaller gate contacts (e.g., 121) are formed in a self-aligned manner by separating the fill metal in the opening 118 using the cut pattern 106. This helps to reduce the manufacturing cost (e.g., less stringent requirement for the photolithography tool), and may also improve production yields (e.g., self-aligned gate contacts are easier to form and less likely to have issues associated with filling high aspect ratio openings).

In some embodiments, a thickness T3 of the dielectric layer 119 is between about 0 nm and about 50 nm. A width T6 of the residue portions of the dielectric layer 103 at the sidewall of the gate contact 121 is between about 0 nm and about 30 nm, in some embodiments. A thickness T7 of the dielectric layer 103 over the metal gate 97, measured along the middle of the dielectric layer 103, may be between about 1 nm and about 80 nm. A thickness T8 of the dielectric layer 103, measured at the corner of the dielectric layer 103 (e.g., directly over the gate spacers 87), may be between about 0 nm and about 60 nm. A thickness T9 of the residue oxide 90/92 along the sidewall of the cut pattern 106 may be between about 0 nm and about 30 nm.

Additional processing may be performed to complete the fabrication of the FinFET device 100, such as forming additional dielectric layers and forming source/drain contacts. Details are not discussed here.

Variations and modifications to the disclosed embodiment are possible and are fully intended to be included within the scope of the present disclosure. For example, the cut patterns 106 may be formed of a single dielectric material (e.g., 105) instead of being formed of two different dielectric materials (e.g., 105 and 107). As another example, the dielectric layer 119 over the electrically conductive material 111 may be omitted. As yet another example, the liner 109 may be omitted. As an additional example, the etching process to form the opening 102 (see FIGS. 11A-11C) may leave some residue oxide 90/92 at the bottom of the openings 102, such that the residue oxide 90/92 remain between the cut patterns 106 and the substrate 50. These variations may be combined to form different embodiments, some of which are discussed below.

FIGS. 19A-34B illustrate various alternative embodiments, where Figures (e.g., 19A and 19B) with the same numeral but different letters refer to the same embodiment but along different cross-sections. For example, FIG. 19A illustrates a cross-sectional view of a FinFET device along cross-section C-C, and FIG. 19B illustrates a cross-sectional view of the FinFET device along cross-section D-D.

Figure 19A:
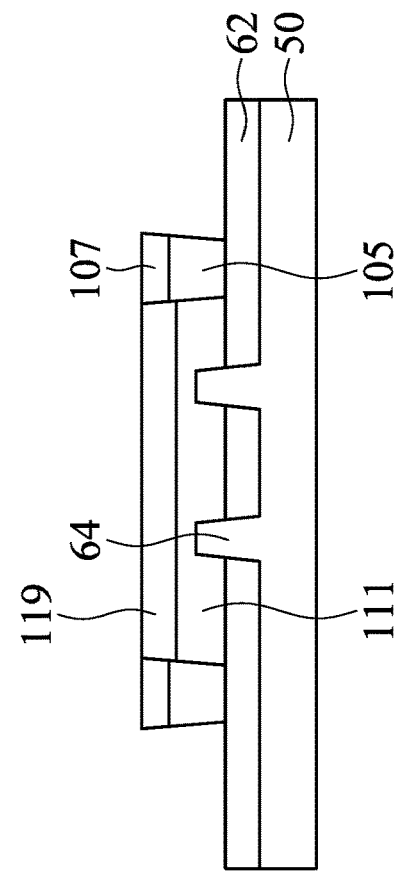
FIGS. 19A and 19B illustrate cross-sectional views of a FinFET device, in accordance with an embodiment.
Figure 19B:
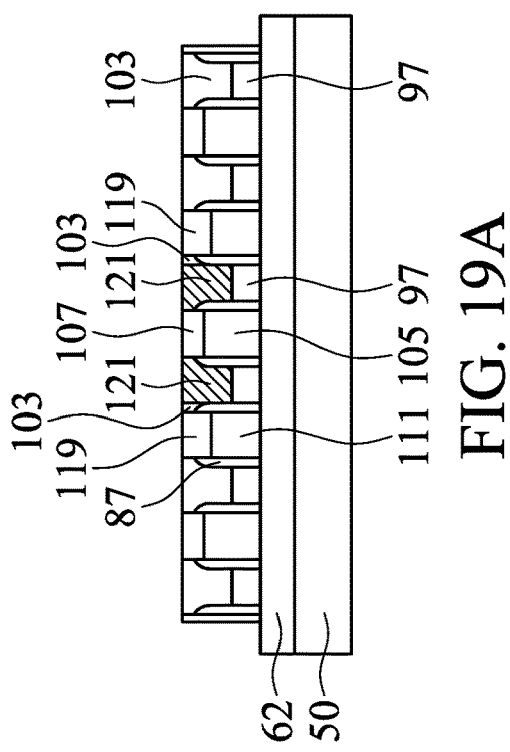

Referring now to FIGS. 19A and 19B, FIGS. 19A and 19B illustrate cross-sectional views of a FinFET device similar to the FinFET device 100 in FIGS. 18A-18C, but without the liner 109. Note that the oxide 90/92 along the tapered sidewalls of the cut pattern 106 in FIG. 18C is not illustrated in the example of FIG. 19B. This is because a pre-cleaning process (e.g., an etching process) may be performed before the electrically conductive material 111 is formed in the processing step illustrated in FIGS. 16A-16C. The pre-cleaning process may consume the oxide 90/92 if the liner 109 is not formed. In embodiments where the liner 109 is formed (see, e.g., 18C), the liner 109 protects the oxide 90/92 from the pre-cleaning process, thus the oxide 90/92 remains in the device formed.

Figure 20A:
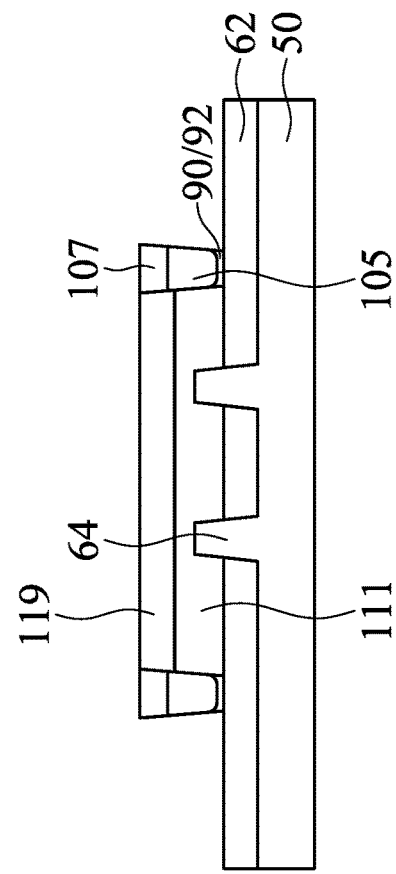
FIGS. 20A and 20B illustrate cross-sectional views of a FinFET device, in accordance with an embodiment.
Figure 20B:
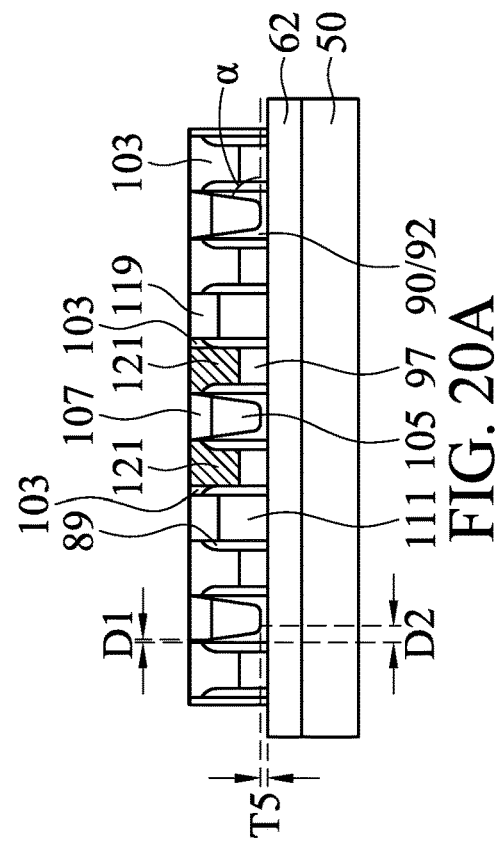

FIGS. 20A and 20B illustrate cross-sectional views of a FinFET device similar to the FinFET device in FIGS. 19A-19C, but with residue oxide 90/92 under the cut pattern 106. In some embodiments, a thickness of T5 of the oxide 90/92 under the cut pattern 106 may be between about 0 nm and about 60 nm. In some embodiments, due to the tapered sidewalls of the cut pattern 106, a distance between the sidewalls of the cut pattern 106 and the gate spacers 87 decreases as the cut pattern 106 extends away from the substrate 50. For example, a distance D2 between the sidewall of the cut pattern 106 and the respective gate spacer 87, measured at the lower surface of the dielectric material 105, may be between about 0 nm and about 30 nm; a distance D1 between the sidewall of the cut pattern 106 and the respective gate spacer 87, measured at the lower surface of the dielectric material 107, may be between about 0 nm and about 20 nm. An angle α, measured between the sidewall of the cut pattern 106 (e.g., sidewall of the dielectric material 105 or sidewall of the dielectric material 107) and the upper surface of the substrate 50, may be between about 65 degrees and 95 degrees.

FIGS. 21A and 21B illustrate cross-sectional views of a FinFET device similar to the FinFET device 100 in FIGS. 18A-18C, but with different shapes for the dielectric layer 103. In particular, the dielectric layer 103 illustrated in FIG. 21A has a T-shaped cross-section with an upper portion and a lower portion, and a substantially right angle between a lower surface of the upper portion and a sidewall of the lower portion. In contrast, the dielectric layer 103 illustrated in FIG. 18B has a smooth curved sidewalls that connect the upper portion and the lower portion of the dielectric layer 103.

FIGS. 22A and 22B illustrate cross-sectional views of a FinFET device similar to the FinFET device 100 in FIGS. 18A-18C, but with residue oxide 90/92 under and around the cut patterns 106.

FIGS. 23A and 23B illustrate cross-sectional views of a FinFET device similar to the FinFET device 100 in FIGS. 18A-18C, but without the liner 109 and without the dielectric layer 119.

FIGS. 24A and 24B illustrate cross-sectional views of a FinFET device similar to the FinFET device in FIGS. 23A and 23B, but with residue oxide 90/92 under the cut patterns 106.

Figure 25A:
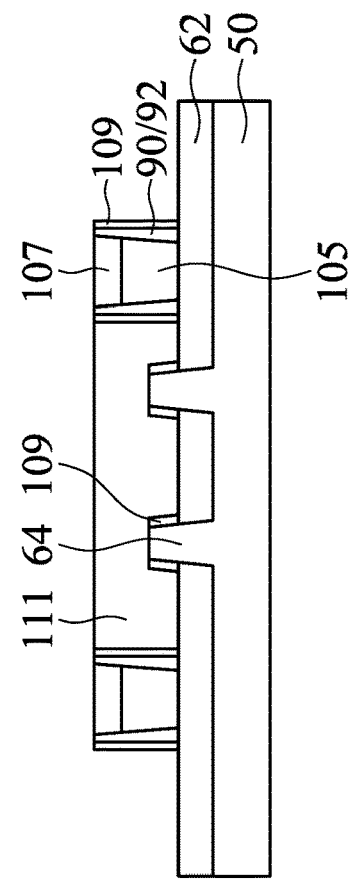
FIGS. 25A and 25B illustrate cross-sectional views of a FinFET device, in accordance with an embodiment.
Figure 25B:
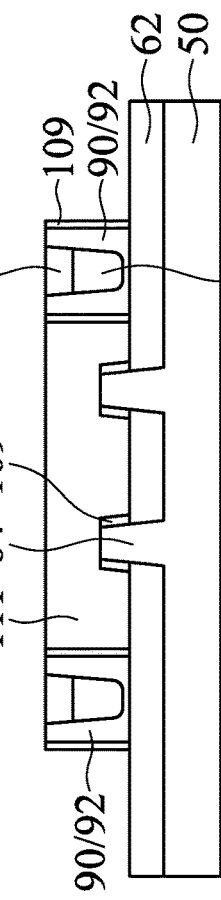

FIGS. 25A and 25B illustrate cross-sectional views of a FinFET device similar to the FinFET device 100 in FIGS. 18A-18C, but without the dielectric layer 119.

Figure 26A:
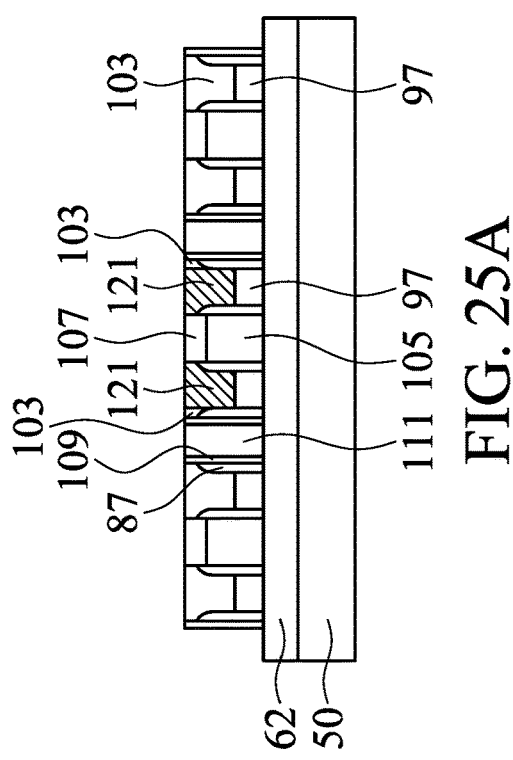
FIGS. 26A and 26B illustrate cross-sectional views of a FinFET device, in accordance with an embodiment.
Figure 26B:
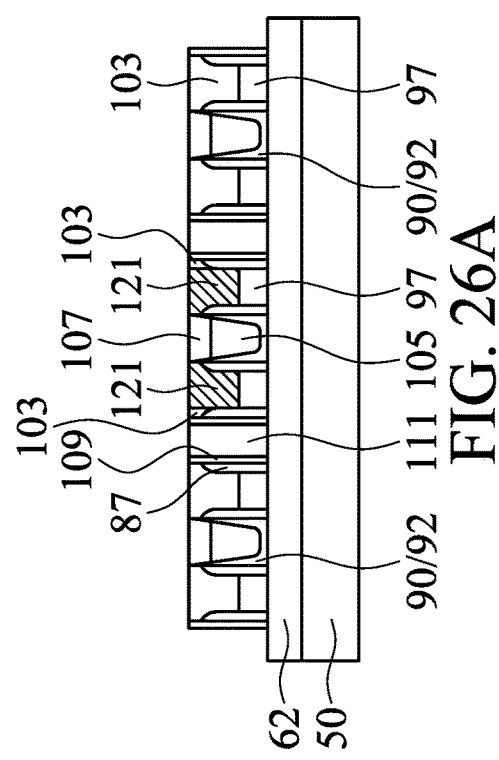

FIGS. 26A and 26B illustrate cross-sectional views of a FinFET device similar to the FinFET device in FIGS. 25A and 25B, but with residue oxide 90/92 under the cut patterns 106.

Figure 27A:
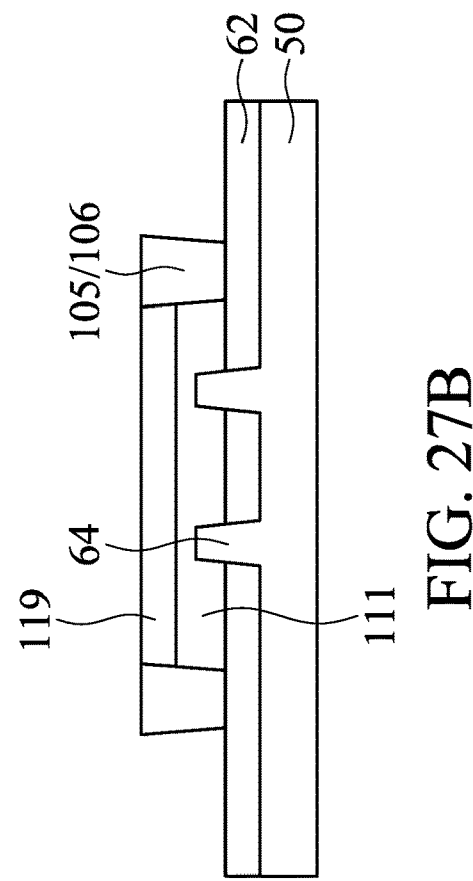
FIGS. 27A and 27B illustrate cross-sectional views of a FinFET device, in accordance with an embodiment.
Figure 27B:
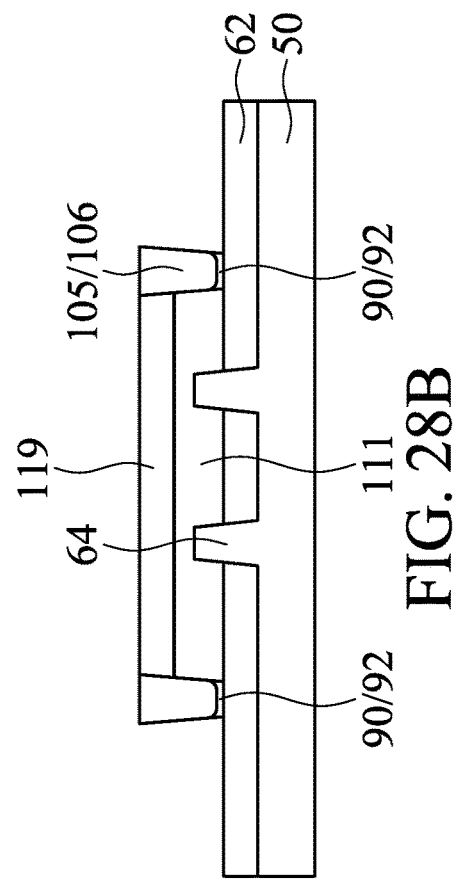

FIGS. 27A and 27B illustrate cross-sectional views of a FinFET device similar to the FinFET device 100 in FIGS. 18A-18C, but without the liner 109 and without the dielectric material 107. In other words, the cut patterns 106 are formed of a single material (e.g., 105). In embodiments where the cut patterns 106 are formed of the dielectric material 105 only (instead of 105 and 107), the dielectric material 105 is different (e.g., having a different composition) from the dielectric layer 103 to provide etching selectivity in the process to form gate contacts 121.

Figure 28A:
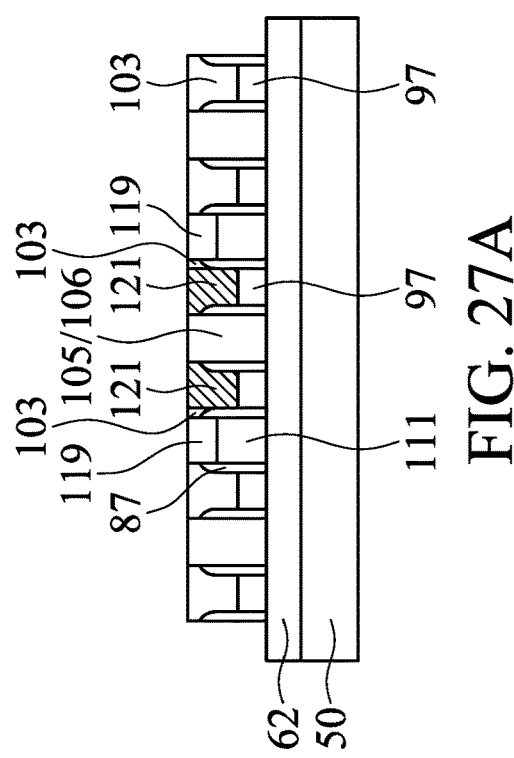
FIGS. 28A and 28B illustrate cross-sectional views of a FinFET device, in accordance with an embodiment.
Figure 28B:
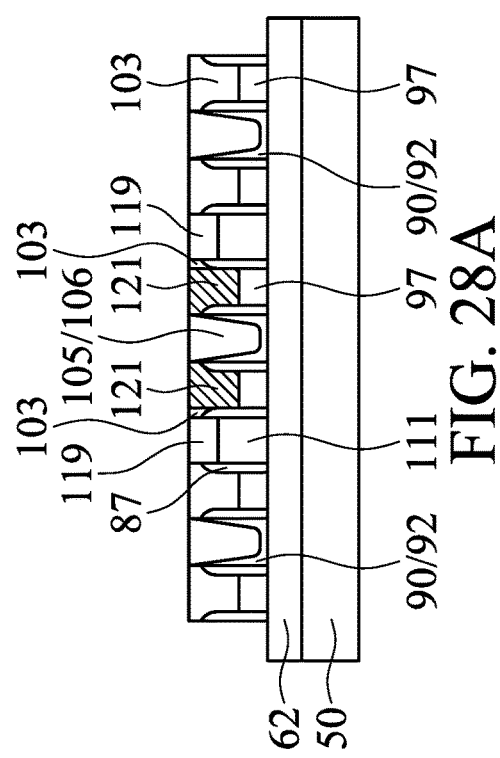

FIGS. 28A and 28B illustrate cross-sectional views of a FinFET device similar to the FinFET device in FIGS. 27A and 27B, but with residue oxide 90/92 under the cut patterns 106.

FIGS. 29A and 29B illustrate cross-sectional views of a FinFET device similar to the FinFET device in FIGS. 27A and 27B, but with the liner 109.

FIGS. 30A and 30B illustrate cross-sectional views of a FinFET device similar to the FinFET device in FIGS. 29A and 29B, but with residue oxide 90/92 under the cut patterns 106.

Figure 31A:
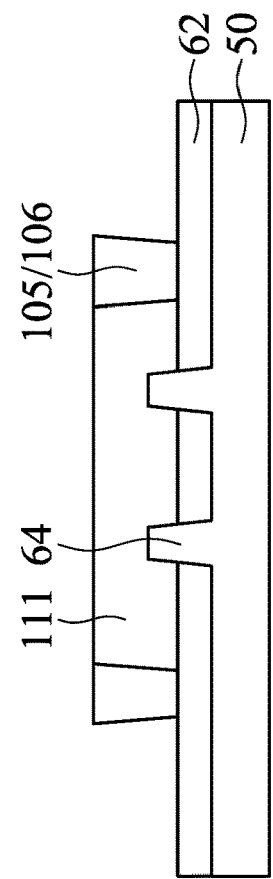
FIGS. 31A and 32B illustrate cross-sectional views of a FinFET device, in accordance with an embodiment.
Figure 31B:
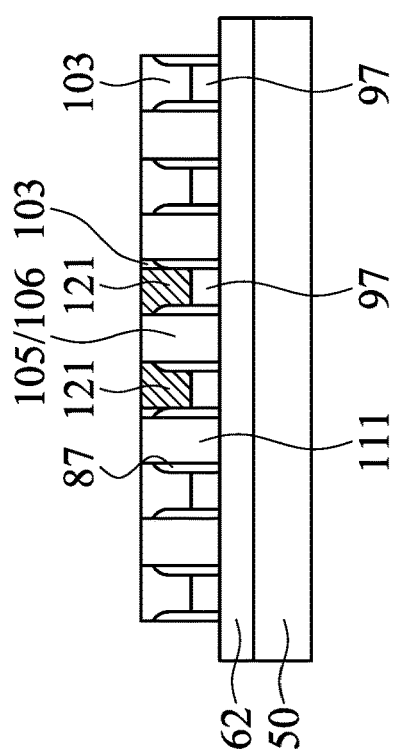

FIGS. 31A and 31B illustrate cross-sectional views of a FinFET device similar to the FinFET device in FIGS. 27A and 27B, but without the dielectric layer 119.

Figure 32A:
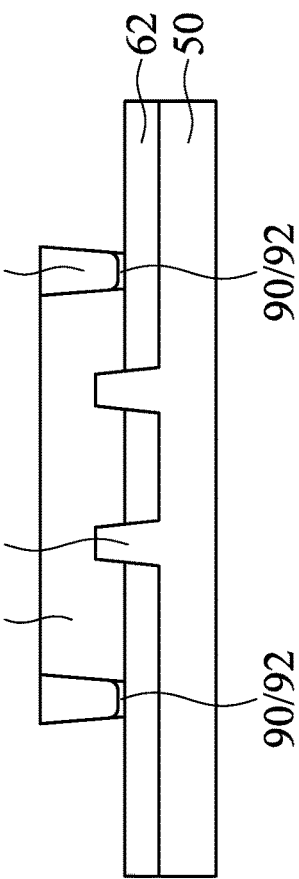
Figure 32B:
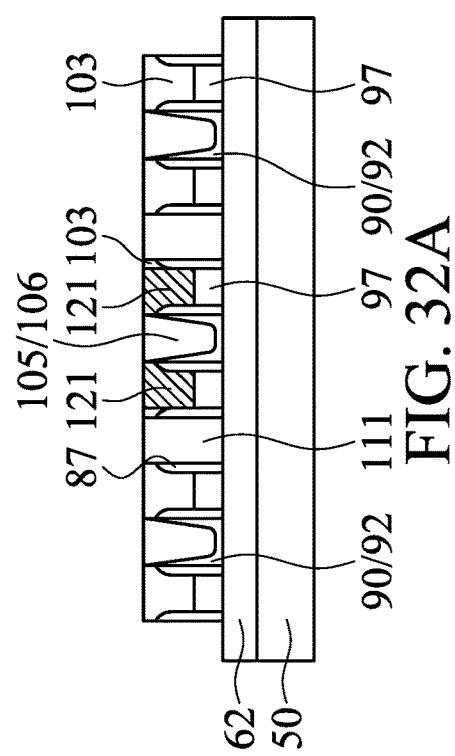

FIGS. 32A and 32B illustrate cross-sectional views of a FinFET device similar to the FinFET device in FIGS. 31A and 31B, but with residue oxide 90/92 under the cut patterns 106.

FIGS. 33A and 33B illustrate cross-sectional views of a FinFET device similar to the FinFET device in FIGS. 27A and 27B, but with the liner 109 and without the dielectric layer 119.

FIGS. 34A and 34B illustrate cross-sectional views of a FinFET device similar to the FinFET device in FIGS. 33A and 33B, but with residue oxide 90/92 under the cut patterns 106.

FIG. 35 illustrates a flow chart of a method of fabricating a semiconductor device, in accordance with some embodiments. It should be understood that the embodiment method shown in FIG. 35 is merely an example of many possible embodiment methods. One of ordinary skill in the art would recognize many variations, alternatives, and modifications. For example, various steps as illustrated in FIG. 35 may be added, removed, replaced, rearranged and repeated.

Referring to FIG. 35, at step 1010, a first dummy gate and a second dummy gate are formed over a fin, the fin protruding above a substrate. At step 1020, the first dummy gate and the second dummy gate are replaced with a first metal gate and a second metal gate, respectively. At step 1030, a dielectric cut pattern is formed between the first metal gate and the second metal gate, the dielectric cut pattern extending further from the substrate than the first metal gate and the second metal gate. At step 1040, a patterned mask layer is formed over the first metal gate, the second metal gate, and the dielectric cut pattern, where an opening in the patterned mask layer exposes a portion of the first metal gate, a portion of the second metal gate, and a portion of the dielectric cut pattern underlying the opening. At step 1050, the opening is filled with a first electrically conductive material. At step 1060, the first electrically conductive material is recessed below an upper surface of the dielectric cut pattern distal to the substrate.

Embodiments may achieve advantages. The present disclosed methods avoids or reduces the issue of hard mask layer 101 peel-off during formation of the cut patterns 106, thereby avoiding formation of incorrect cut patterns 106 and electrical short between source/drain regions that are designed to be separated. Due to the improved physical properties of the materials of the cut pattern 106, the TDDB performance between adjacent source/drain regions of the device is improved. In addition, the cut patterns 106 allow gate contact plugs to be formed in a self-aligned manner, which allows photolithography tool with lower resolution to be used in forming the gate contact plugs with close spacing. As a result, production cost is reduced, and production yield is improved.

In an embodiment, a method includes forming a first dummy gate and a second dummy gate over a fin, the fin protruding above a substrate; replacing the first dummy gate and the second dummy gate with a first metal gate and a second metal gate, respectively; forming a dielectric cut pattern between the first metal gate and the second metal gate, the dielectric cut pattern extending further from the substrate than the first metal gate and the second metal gate; forming a patterned mask layer over the first metal gate, the second metal gate, and the dielectric cut pattern, an opening in the patterned mask layer exposing a portion of the first metal gate, a portion of the second metal gate, and a portion of the dielectric cut pattern underlying the opening; filling the opening with a first electrically conductive material; and recessing the first electrically conductive material below an upper surface of the dielectric cut pattern distal to the substrate. In an embodiment, replacing the first dummy gate and the second dummy gate comprises: forming a dielectric layer around the first dummy gate and the second dummy gate; removing the first dummy gate and the second dummy gate to form a first recess and a second recess in the dielectric layer, respectively; and filling the first recess and the second recess with one or more electrically conductive materials to form the first metal gate and the second metal gate. In an embodiment, forming the dielectric cut pattern comprises: forming an opening in a dielectric layer that is around the first metal gate and the second metal gate, the opening being between the first metal gate and the second metal gate; and fill the opening in the dielectric layer with one or more dielectric materials. In an embodiment, the opening in the dielectric layer extends through the dielectric layer. In an embodiment, a bottom of the opening in the dielectric layer is formed between an upper surface of the dielectric layer facing away from the substrate and a lower surface of the dielectric layer facing the substrate, wherein after the dielectric cut pattern is formed, a portion of the dielectric layer is between the dielectric cut pattern and the substrate. In an embodiment, filling the opening in the dielectric layer comprises: forming a first dielectric material in a bottom portion of the opening in the dielectric layer; and forming a second dielectric material different from the first dielectric material in an upper portion of the opening in the dielectric layer. In an embodiment, the method further includes, before forming the dielectric cut pattern, replacing upper portions of the first metal gate and upper portions of the second metal gate with a third dielectric material. In an embodiment, the second dielectric material is different from the third dielectric material. In an embodiment, the dielectric cut pattern is formed at a first location between the first metal gate and the second metal gate, wherein the method further comprises forming a second electrically conductive material in a second location adjacent to the first location, the second location being between the first metal gate and the second metal gate. In an embodiment, the method further includes, before forming the second electrically conductive material, forming a liner layer along sidewalls of the dielectric cut pattern, along sidewalls of the first metal gate, and along sidewalls of the second metal gate. In an embodiment, the method further includes, after forming the second electrically conductive material, replacing upper portions of the second electrically conductive material with a dielectric material. In an embodiment, an upper surface of the dielectric material distal to the substrate is level with the upper surface of the dielectric cut pattern.

In an embodiment, a method includes forming a first dummy gate and a second dummy gate over a first fin that protrudes above a substrate; forming an interlayer dielectric (ILD) layer around the first dummy gate and the second dummy gate; replacing the first dummy gate and the second dummy gate with a first metal gate and a second metal gate, respectively; forming a first opening in the ILD layer between the first metal gate and the second metal gate, wherein the first opening is spaced apart from the first fin; filling the first opening with one or more dielectric materials to form a cut pattern; removing the ILD layer after the cut pattern is formed, wherein removing the ILD layer forms recesses between the first metal gate and the second metal gate; and filling the recesses with a first electrically conductive material, wherein the cut pattern separates the first electrically conductive material into a first portion and a second portion. In an embodiment, the method further includes forming a patterned mask layer over the first metal gate, the second metal gate, the cut pattern, and the first electrically conductive material, wherein a second opening in the patterned mask layer exposes the first metal gate and the second metal gate; filling the second opening with a second electrically conductive material; and removing upper portions of the second electrically conductive material such that the cut pattern extends further from the substrate than the second electrically conductive material, thereby separating the second electrically conductive material into a first contact plug and a second contact plug. In an embodiment, the method further includes, before forming the first opening: recessing the first metal gate to form a first recess between first gate spacers of the first metal gate; recessing the second metal gate to form a second recess between second gate spacers of the second metal gate; and filling the first recess and the second recess with a first dielectric material. In an embodiment, filling the first opening includes forming a second dielectric material in the first opening to partially fill the first opening; and forming a third dielectric material in the first opening and over the second dielectric material, wherein a composition of the third dielectric material is different from that of the second dielectric material and from that of the first dielectric material. In an embodiment, a depth of the first opening in the ILD layer is smaller than a thickness of the ILD layer, wherein removing the ILD layer removes a first portion of the ILD layer around the cut pattern, and a second portion of the ILD layer between the cut pattern and the substrate remain after removing the ILD layer.

In an embodiment, a semiconductor device includes a fin over a substrate; a first metal gate over the fin and a second metal gate over the fin; a first dielectric cut pattern between the first metal gate and the second metal gate, wherein the first dielectric cut pattern is spaced apart from the fin, wherein the first dielectric cut pattern extends further from the substrate than a first gate electrode of the first metal gate and a second gate electrode of the second metal gate; a dielectric layer over and contacting the first gate electrode and the second gate electrode, wherein an upper surface of the dielectric layer is level with a first upper surface of the first dielectric cut pattern; and a first contact plug and a second contact plug over and connected to the first gate electrode and the second gate electrode, respectively, wherein the first contact plug and the second contact plug extend through the dielectric layer and contact opposing sidewalls of the first dielectric cut pattern. In an embodiment, the semiconductor device further includes a second dielectric cut pattern between the first metal gate and the second metal gate, wherein the second dielectric cut pattern is spaced apart from the fin, and has a second upper surface that is level with the first upper surface of the first dielectric cut pattern; and an electrically conductive material between the first metal gate and the second metal gate, wherein the electrically conductive material extends continuously from the first dielectric cut pattern to the second dielectric cut pattern. In an embodiment, a third upper surface of the electrically conductive material is level with the first upper surface of the first dielectric cut pattern, or is closer to the substrate than the first upper surface of the first dielectric cut pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dummy gate and a second dummy gate over a fin, the fin protruding above a substrate;
    replacing the first dummy gate and the second dummy gate with a first metal gate and a second metal gate, respectively;
    forming a dielectric cut pattern between the first metal gate and the second metal gate, the dielectric cut pattern extending further from the substrate than the first metal gate and the second metal gate;
    forming a patterned mask layer over the first metal gate, the second metal gate, and the dielectric cut pattern, an opening in the patterned mask layer exposing a portion of a first gate electrode of the first metal gate, a portion of a second gate electrode of the second metal gate, and a portion of the dielectric cut pattern underlying the opening;
    filling the opening with a first electrically conductive material, the first electrically conductive material contacting the first gate electrode of the first metal gate and the second gate electrode of the second metal gate; and
    recessing the first electrically conductive material such that an upper surface of the first electrically conductive material is level with or below an upper surface of the dielectric cut pattern distal to the substrate.

2. The method of claim 1, wherein replacing the first dummy gate and the second dummy gate comprises:
    forming a dielectric layer around the first dummy gate and the second dummy gate;
    removing the first dummy gate and the second dummy gate to form a first recess and a second recess in the dielectric layer, respectively; and
    filling the first recess and the second recess with one or more electrically conductive materials to form the first metal gate and the second metal gate.

3. The method of claim 1, wherein forming the dielectric cut pattern comprises:
    forming an opening in a dielectric layer that is around the first metal gate and the second metal gate, the opening being between the first metal gate and the second metal gate; and
    filling the opening in the dielectric layer with one or more dielectric materials.

4. The method of claim 3, wherein the opening in the dielectric layer extends through the dielectric layer.

5. The method of claim 3, wherein a bottom of the opening in the dielectric layer is formed between an upper surface of the dielectric layer facing away from the substrate and a lower surface of the dielectric layer facing the substrate, wherein after the dielectric cut pattern is formed, a portion of the dielectric layer is between the dielectric cut pattern and the substrate.

6. The method of claim 3, wherein filling the opening in the dielectric layer comprises:
    forming a first dielectric material in a bottom portion of the opening in the dielectric layer; and
    forming a second dielectric material different from the first dielectric material in an upper portion of the opening in the dielectric layer.

7. The method of claim 6, further comprising, before forming the dielectric cut pattern, replacing upper portions of the first metal gate and upper portions of the second metal gate with a third dielectric material.

8. The method of claim 7, wherein the second dielectric material is different from the third dielectric material.

9. The method of claim 1, wherein the dielectric cut pattern is formed at a first location between the first metal gate and the second metal gate, wherein the method further comprises forming a second electrically conductive material in a second location adjacent to the first location, the second location being between the first metal gate and the second metal gate.

10. The method of claim 9, further comprising, before forming the second electrically conductive material, forming a liner layer along sidewalls of the dielectric cut pattern, along sidewalls of the first metal gate, and along sidewalls of the second metal gate.

11. The method of claim 9, further comprising, after forming the second electrically conductive material, replacing upper portions of the second electrically conductive material with a dielectric material.

12. The method of claim 11, wherein an upper surface of the dielectric material distal to the substrate is level with the upper surface of the dielectric cut pattern.

13. A method comprising:
    forming a first dummy gate and a second dummy gate over a first fin that protrudes above a substrate;
    forming an interlayer dielectric (ILD) layer around the first dummy gate and the second dummy gate;
    replacing the first dummy gate and the second dummy gate with a first metal gate and a second metal gate, respectively;
    forming a first opening in the ILD layer between the first metal gate and the second metal gate, wherein in a top view, the first opening is spaced apart from the first fin;
    filling the first opening with one or more dielectric materials to form a cut pattern;
    removing the ILD layer after the cut pattern is formed, wherein removing the ILD layer forms a first recess and a second recess that are between the first metal gate and the second metal gate, wherein the cut pattern is laterally between the first recess and the second recess; and
    filling the first recess and the second recess with a first electrically conductive material, wherein the cut pattern separates the first electrically conductive material into a first portion and a second portion spaced apart from the first portion.

14. The method of claim 13, further comprising:
    forming a patterned mask layer over the first metal gate, the second metal gate, the cut pattern, and the first electrically conductive material, wherein a second opening in the patterned mask layer exposes the first metal gate and the second metal gate;
    filling the second opening with a second electrically conductive material; and removing upper portions of the second electrically conductive material such that the cut pattern extends further from the substrate than the second electrically conductive material, thereby separating the second electrically conductive material into a first contact plug and a second contact plug.

15. The method of claim 13, further comprising, before forming the first opening:

recessing the first metal gate to form a third recess between first gate spacers of the first metal gate;

recessing the second metal gate to form a fourth recess between second gate spacers of the second metal gate; and filling the third recess and the fourth recess with a first dielectric material.

16. The method of claim 15, wherein filling the first opening comprises:

forming a second dielectric material in the first opening to partially fill the first opening; and forming a third dielectric material in the first opening and over the second dielectric material, wherein a composition of the third dielectric material is different from that of the second dielectric material and from that of the first dielectric material.

17. The method of claim 13, wherein a depth of the first opening in the ILD layer is smaller than a thickness of the ILD layer, wherein removing the ILD layer removes a first portion of the ILD layer around the cut pattern, and a second portion of the ILD layer between the cut pattern and the substrate remain after removing the ILD layer.

18. A semiconductor device comprising:

a fin over a substrate;

a first metal gate over the fin and a second metal gate over the fin;

a first dielectric cut pattern between the first metal gate and the second metal gate, wherein the first dielectric cut pattern is spaced apart from the fin, wherein the first dielectric cut pattern extends further from the substrate than a first gate electrode of the first metal gate and a second gate electrode of the second metal gate;

a dielectric layer over and contacting the first gate electrode and the second gate electrode, wherein an upper surface of the dielectric layer is level with a first upper surface of the first dielectric cut pattern; and a first contact plug and a second contact plug that are disposed over and electrically coupled to the first gate electrode and the second gate electrode, respectively, wherein the first contact plug and the second contact plug extend through the dielectric layer and contact opposing sidewalls of the first dielectric cut pattern.

19. The semiconductor device of claim 18, further comprising:

a second dielectric cut pattern between the first metal gate and the second metal gate, wherein the second dielectric cut pattern is spaced apart from the fin, and has a second upper surface that is level with the first upper surface of the first dielectric cut pattern; and an electrically conductive material between the first metal gate and the second metal gate, wherein the electrically conductive material extends continuously from the first dielectric cut pattern to the second dielectric cut pattern.

20. The semiconductor device of claim 19, wherein a third upper surface of the electrically conductive material is level with the first upper surface of the first dielectric cut pattern, or is closer to the substrate than the first upper surface of the first dielectric cut pattern.

* * * * *